(12) United States Patent
Yuan

(10) Patent No.: US 11,837,136 B2
(45) Date of Patent: Dec. 5, 2023

(54) DISPLAY PANEL AND DISPLAY DEVICE

(71) Applicant: Xiamen Tianma Micro-Electronics Co., Ltd., Xiamen (CN)

(72) Inventor: Yong Yuan, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 18/115,476

(22) Filed: Feb. 28, 2023

(65) Prior Publication Data
US 2023/0206806 A1 Jun. 29, 2023

Related U.S. Application Data

(63) Continuation of application No. 17/878,204, filed on Aug. 1, 2022, now Pat. No. 11,615,728, which is a continuation of application No. 17/520,520, filed on Nov. 5, 2021, now Pat. No. 11,430,365.

(30) Foreign Application Priority Data

Dec. 31, 2020 (CN) .......................... 202011621871.7

(51) Int. Cl.
*G09G 3/20* (2006.01)
*G11C 19/28* (2006.01)

(52) U.S. Cl.
CPC ............ *G09G 3/20* (2013.01); *G11C 19/287* (2013.01); *G09G 2300/08* (2013.01); *G09G 2310/0243* (2013.01); *G09G 2310/0267* (2013.01); *G09G 2310/0286* (2013.01); *G09G 2310/08* (2013.01); *G09G 2320/02* (2013.01)

(58) Field of Classification Search
CPC ................. G09G 3/20; G09G 2300/08; G09G 2310/0243; G09G 2310/0267; G09G 2310/0286; G09G 2310/08; G09G 2320/02; G11C 19/287
See application file for complete search history.

(56) References Cited

U.S. PATENT DOCUMENTS

| 2019/0235818 | A1* | 8/2019 | Cha ........................... G06T 7/70 |
| 2019/0237020 | A1* | 8/2019 | Park ..................... G09G 3/3258 |
| 2019/0237036 | A1* | 8/2019 | Kurihara ............... G02F 1/1368 |

* cited by examiner

*Primary Examiner* — Sejoon Ahn
(74) *Attorney, Agent, or Firm* — KDW Firm PLLC

(57) ABSTRACT

Provided are a display panel and display device. The display panel includes a driver circuit comprising a shift register that is N-stage cascaded; wherein the shift register comprises: a third control unit configured to receive a first voltage signal and generate an output signal in response to a signal of a third node, or receive a second voltage signal and generate an output signal in response to a signal of a second node; and a fourth control comprising a first capacitor and a first transistor, wherein a second plate of the first capacitor is connected to a drain of the first transistor, a first plate of the first capacitor and a gate of the first transistor are connected to a same node; and/or a first plate of the first capacitor and a gate of the first transistor receive a same signal.

20 Claims, 24 Drawing Sheets

DISPLAY PANEL AND DISPLAY DEVICE

CROSS-REFERENCE TO RELATED APPLICATION(S)

This is a continuation application of U.S. patent application Ser. No. 17/878,204, filed on Aug. 1, 2022, which claims priority to Chinese Patent Application No. 202011621871.7 filed Dec. 31, 2020, the disclosures of which are incorporated herein by reference in their entirety.

TECHNICAL FIELD

The present disclosure relates to the field of display panel and, in particular, to a display panel and a display device.

BACKGROUND

In the field of display, the shift register is often used in order to implement scanning display or other functions. However, when the shift register operates, the voltage of the control node inside the shift register inevitably has a threshold loss. Therefore, the transistor in the corresponding shift register cannot sufficiently be on so that the level of the output terminal of the shift register cannot reach the target voltage, causing the tailing phenomenon to occur and affecting the display effect.

When the output signal of the p-type metal oxide semiconductor (PMOS) transistor in the shift register is transitioned from a high level to a low level, the potential of the gate of the PMOS transistor is potential Vgl, and the potential of the source of the PMOS transistor is also potential Vgl, that is, the potential of both the gate and the source of the PMOS transistor are potential Vgl, and the PMOS transistor operates in an unsaturated state, causing the voltage of the drain output to be |Vgl|−|Vth|, where Vth is the threshold voltage of the PMOS transistor.

Since the voltage of the drain output of the PMOS transistor does not reach the effect of the predetermined output Vgl, there is the tailing phenomenon when the output pulse signal of the existing shift register transitions from a high level to a low level.

SUMMARY

The present disclosure provides a display panel and a display device.

In a first aspect, the embodiments of the present disclosure provide a display panel. The display panel includes a driver circuit.

The driver circuit includes an N-stage cascaded shift register, where N is greater than or equal to 2.

The shift register includes a first control unit, a second control unit, a third control unit, and a fourth control unit.

The first control unit is configured to receive an input signal and control a signal of a first node in response to a first clock signal.

The second control unit is configured to receive a first voltage signal and a second voltage signal and control a signal of a second node in response to the signal of the first node, the first clock signal, and a second clock signal.

The third control unit is configured to receive the first voltage signal and generate an output signal in response to a signal of a third node, or receive the second voltage signal and generate an output signal in response to the signal of the second node, where the third node is connected to the first node, the first voltage signal is a low level signal, and the second voltage signal is a high level signal.

The fourth control unit is connected to the third node and configured to control a potential of the third node to be a first low level signal for at least a first time period within time when the first node is a low level signal, where the potential of the first low level signal is lower than the potential of the first voltage signal.

In a second aspect, the embodiments of the present disclosure further provide a display device including the display panel described in the first aspect.

The display panel provided by the embodiments of the present disclosure includes a driver circuit, where the driver circuit includes an N-stage cascaded shift register which includes a first control unit, a second control unit, a third control unit, and a fourth control unit, where the third control unit is configured to receive the first voltage signal and generate the output signal in response to the signal of a third node, or receive the second voltage signal and generate the output signal in response to the signal of the second node. Since the fourth control unit is connected to the third node and can control the potential of the third node to be the potential of the first low level signal for at least the first time period within time when the first node is the low level signal, and the potential of the first low level signal is lower than the potential of the first voltage signal, that is, the potential of the third node is lower than the potential of the first voltage signal so that the transistor in the third control unit rapidly approaches the saturation state and outputs the first voltage signal, thereby avoiding the tailing problem.

DETAILED DESCRIPTION

Figure 1:
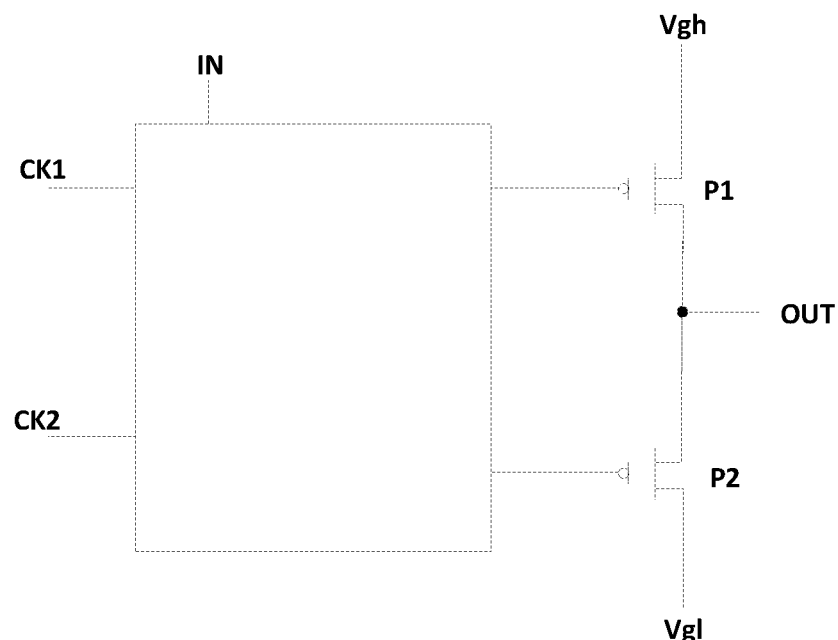
FIG. 1 is a structural diagram of a shift register in the related art.

Hereinafter the present disclosure will be further described in detail in conjunction with drawings and embodiments. It is to be understood that the embodiments set forth herein are intended to explain the present disclosure and not to limit the present disclosure. Additionally, it is to be noted that for ease of description, merely part, not all, of the structures related to the present disclosure are illustrated in the drawings.

Figure 2:
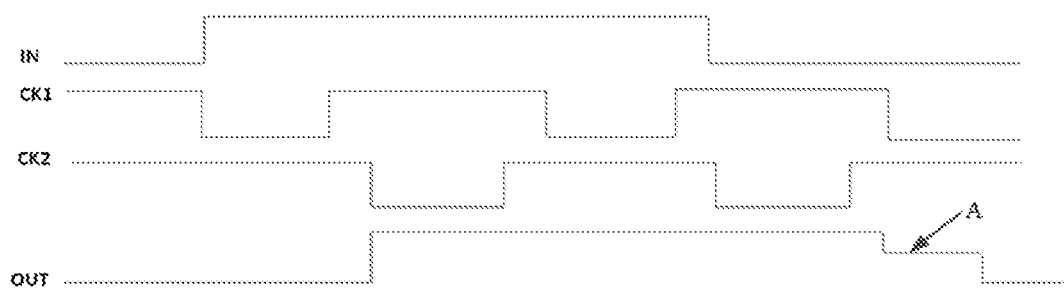
FIG. 2 is a timing diagram of the shift register shown in FIG. 1.

FIG. 1 is a structural diagram of a shift register in the related art, and FIG. 2 is a timing diagram of the shift register shown in FIG. 1. With reference to FIGS. 1 and 2, when the shift register needs to transition from a high level to a low level, the transistor P1 needs to be off, and the transistor P2 needs to be on. In this case, the potential of the gate of the transistor P2 is potential Vgl, and the potential of the source of the transistor P2 is also potential Vgl, that is, the potential of both the gate and the source of the transistor P2 is potential Vgl, and the transistor P2 operates in an unsaturated state, causing the voltage of the drain output of the transistor P2 to be |Vgl|−|Vth|, where Vth is the threshold voltage of the PMOS transistor. Since the voltage of the drain output of the transistor P2 does not reach the effect of the predetermined output Vgl, as shown in FIG. 2, there is the tailing phenomenon when the output pulse signal of the existing shift register transitions from a high level to a low level (the position indicated by the arrow A in FIG. 2).

Figure 3:
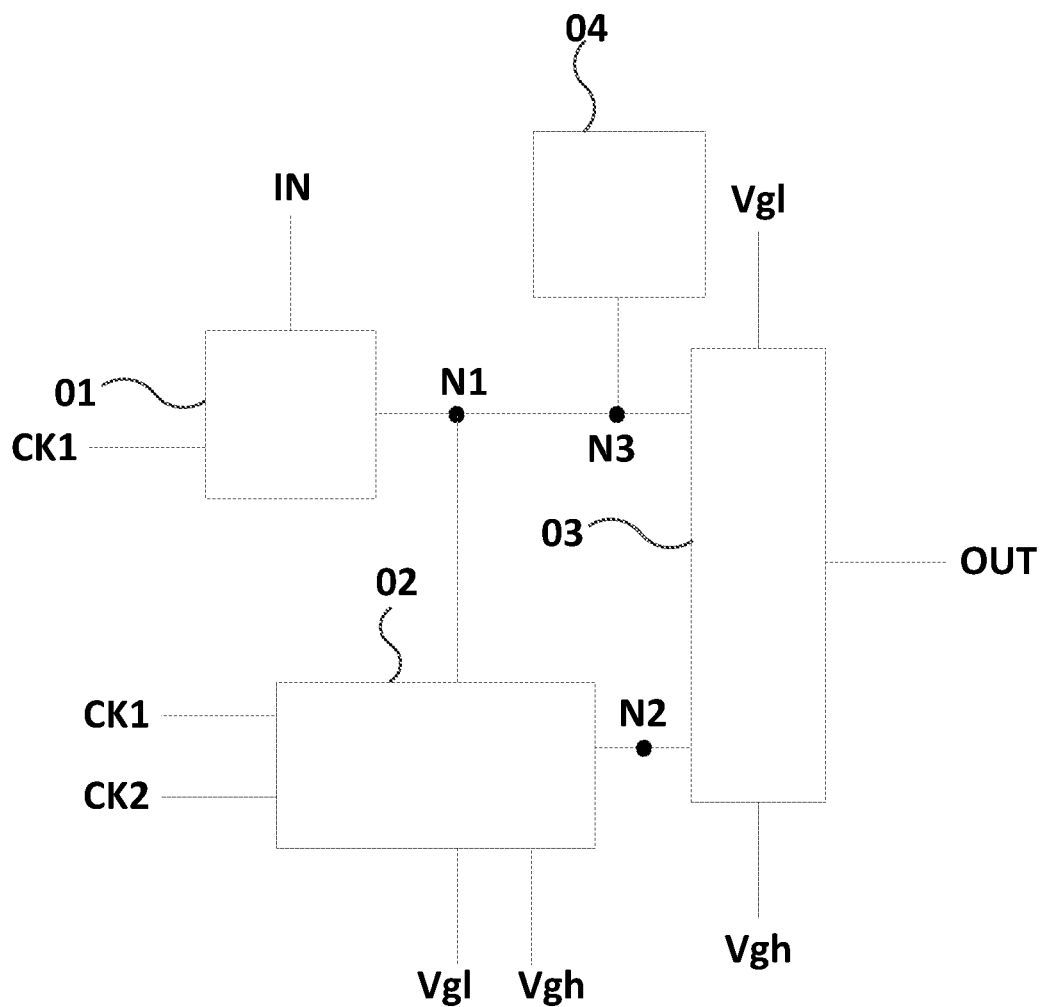
FIG. 3 is a structural diagram of a shift register of a display panel according to an embodiment of the present disclosure.

In view of the above, the embodiments of the present disclosure provide a display panel including a driver circuit. The driver circuit includes an N-stage cascaded shift regis-ter, N being greater than or equal to 2. The driver circuit is configured to output a pulse signal to the display panel row by row. For example, a scan pulse signal is outputted to each scan line of the display panel, or a light emission control pulse signal is outputted to each row of light emission control signal lines of the display panel. FIG. 3 is a structural diagram of a shift register of a display panel according to an embodiment of the present disclosure. As shown in FIG. 3, the shift register of the display panel provided by the embodiment of the present disclosure includes a first control unit 01, a second control unit 02, a third control unit 03, and a fourth control unit 04. The first control unit 01 is configured to receive an input signal IN and control a signal of a first node N1 in response to a first clock signal CK1. The second control unit 02 is configured to receive a first voltage signal Vgl and a second voltage signal Vgh and control a signal of a second node N2 in response to the signal of the first node N1, the first clock signal CK1, and a second clock signal CK2. The third control unit 03 is configured to receive the first voltage signal Vgl and generate the output signal OUT in response to the signal of a third node N3, or receive the second voltage signal Vgh and generate the output signal OUT in response to the signal of the second node N2, where the third node N3 is connected to the first node N1, the first voltage signal Vgl is a low level signal, and the second voltage signal Vgh is a high level signal. In this embodiment of the present disclosure, the fourth control unit 04 is further provided. The fourth control unit 04 is connected to the third node N3. The fourth control unit 04 is configured to control the potential of the third node N3 to be a first low level signal V1 for at least a first time period within time when the first node N1 is a low level signal, where the potential of the first low level signal V1 is lower than the potential of the first voltage signal Vgl. Therefore, the potential of the gate of a transistor for controlling the generation of the output signal OUT in the third control unit 03 is smaller than the potential of the first voltage signal Vgl, and the potential of the source of this transistor is the potential of the first voltage signal Vgl. As a result, the transistor for controlling the generation of the output signal OUT in the third control unit 03 rapidly approaches the saturation state, the voltage of the source and the voltage of the drain of the transistor for controlling the generation of the output signal OUT in the third control unit 03 tend to be equal, and thus the tailing phenomenon can be reduced.

Figure 4:
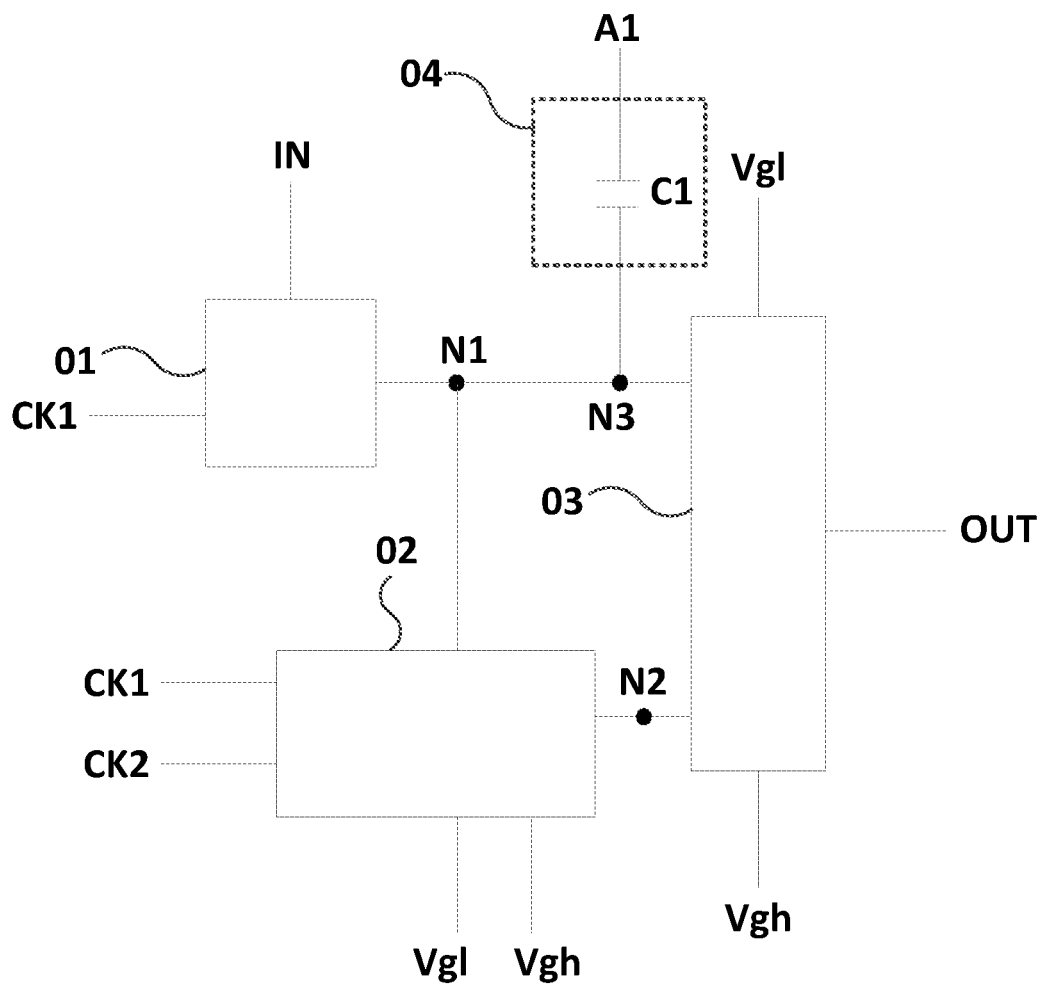
FIG. 4 is a structural diagram of another shift register of a display panel according to an embodiment of the present disclosure.

In an embodiment, on the basis of the above embodiment, the fourth control unit may further include a first capacitor. The first plate of the first capacitor is connected to the third node, and the second plate of the first capacitor receives a first control signal, where the first control signal is a low level signal within the first time period. For example, with reference to FIG. 4, the fourth control unit 04 is provided with a first capacitor C1. The first plate of the first capacitor C1 is connected to the third node N3, and the second plate of the first capacitor C1 receives a first control signal A1. Within the first time period, the first node N1 is at a low level, the first control signal A1 is a low level signal, and the first capacitor C1 is rapidly charged so that the potential of the third node N3 rapidly drops and becomes lower than the potential of the first voltage signal Vgl.

Figure 5:
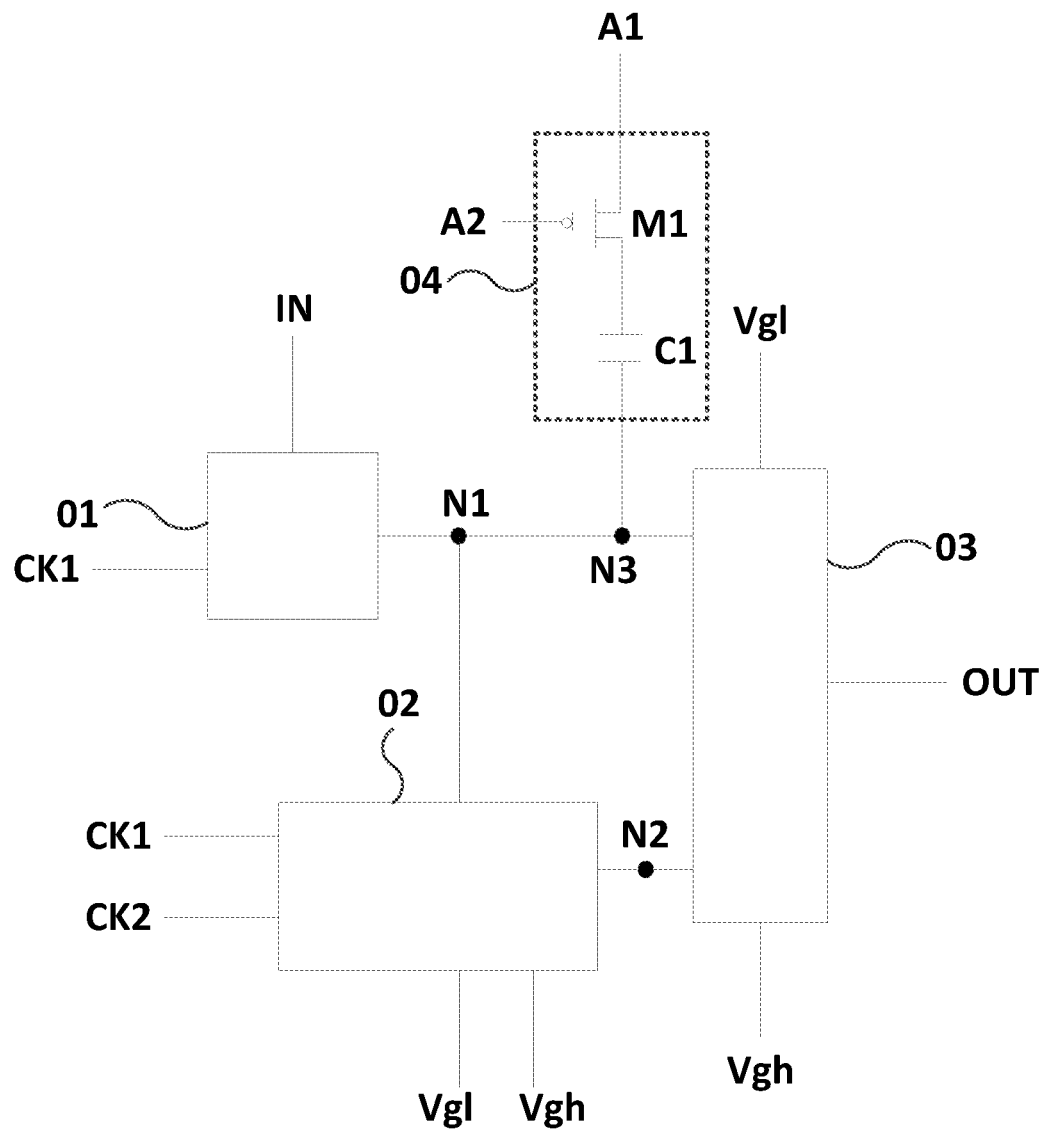
FIG. 5 is a structural diagram of another shift register of a display panel according to an embodiment of the present disclosure.

In an embodiment, with reference to FIG. 5, the fourth control unit 04 may further include a first transistor M1. The source of the first transistor M1 receives the first control signal A1, the drain of the first transistor M1 is connected to the second plate of the first capacitor C1, and the gate of the first transistor M1 receives a second control signal A2, where within the first time period, the second control signal A2 controls the first transistor M1 to be on, the first control signal A1 is transmitted to the first capacitor C1, and in this point, the first node N1 is at a low potential. Under the low level control of the first capacitor C1 and the first control signal A1, the potential of the third node N3 rapidly drops below the potential of the first voltage signal Vgl. When the third control unit 03 receives the second voltage signal Vgh and generates the output signal OUT in response to the signal of the second node N2, it is required that the third node N3 always remains at a high potential. That is, the fourth control unit 04 does not need to keep controlling the potential of the third node N3 to be lower than the potential of the first voltage signal Vgl. Therefore, in this embodiment of the present disclosure, the first transistor M1 is provided. Within the first time period, the first transistor M1 is on to control the potential of the third node N3 to be lower than the potential of the first voltage signal Vgl, and within other time periods, the first transistor M1 may be off to avoid interfering with the potential of the third node N3 and affecting the output signal of the shift register.

Figure 6:
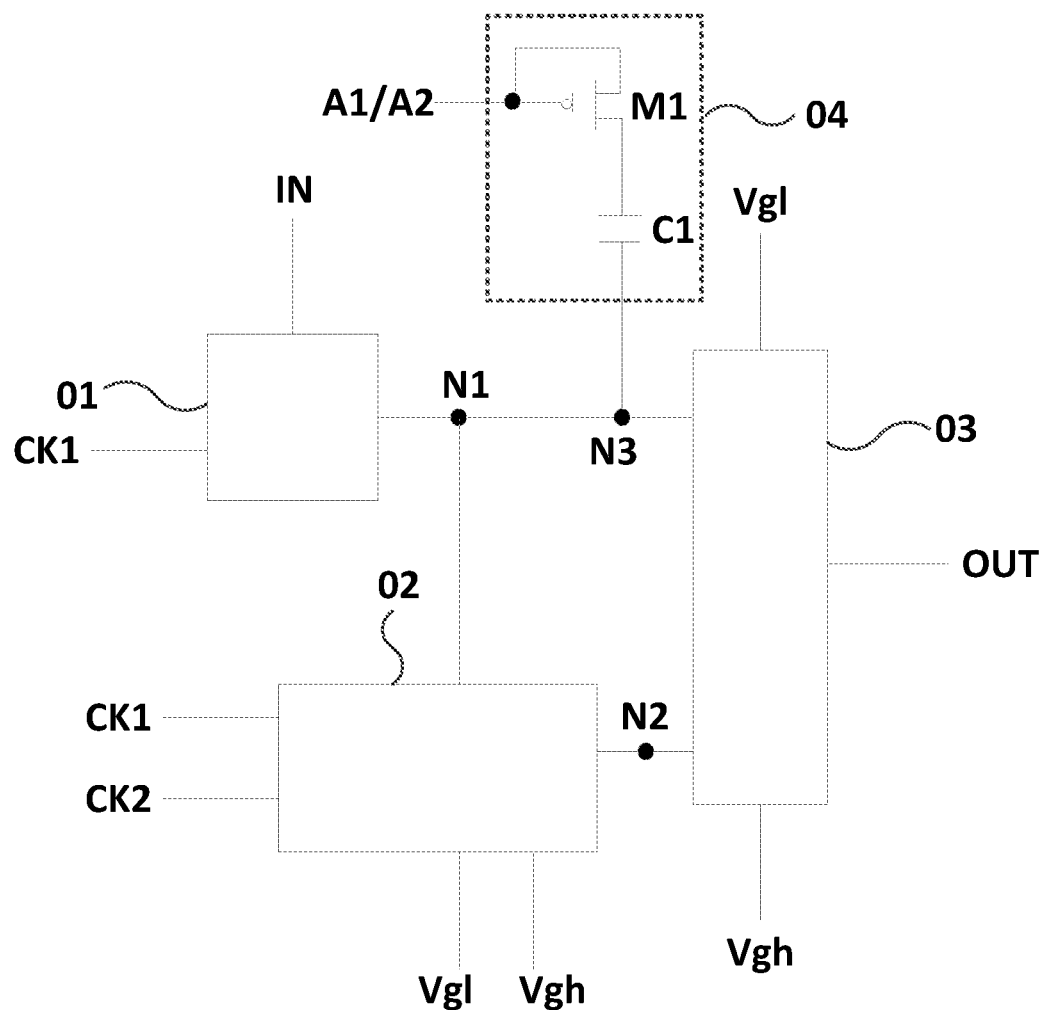
FIG. 6 is a structural diagram of another shift register of a display panel according to an embodiment of the present disclosure.

In an embodiment, the first control signal and the second control signal may further be set to be the same signal. For example, as shown in FIG. 6, the source and the gate of the first transistor M1 are connected to each other, and both receive the first control signal A1 (or the second control signal A2). Such a setting can reduce the number of signal lines in the display panel.

Figure 7:
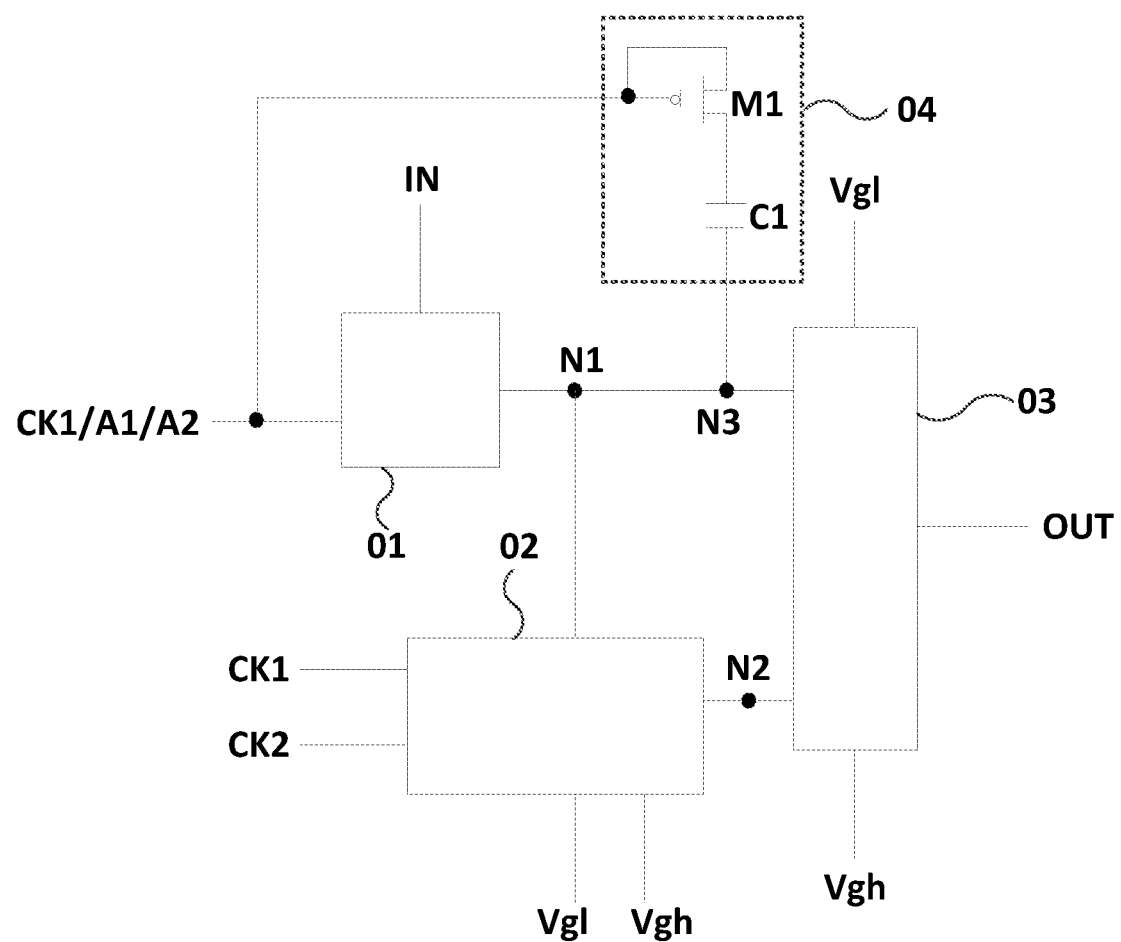
FIG. 7 is a structural diagram of another shift register of a display panel according to an embodiment of the present disclosure.

In an embodiment, the first clock signal CK1 and the first control signal A1 may further be set to be the same signal. As shown in FIG. 7, in this embodiment of the present disclosure, the number of signal lines in the display panel can be further reduced. Through the adjustment of the timing of the shift register, the first clock signal CK1 is ensured to be the low level signal within the first time period so that the fourth control unit can control the potential of the third node to be the first low level signal, that is, the potential of the third node is lower than the potential of the first voltage signal Vgl.

Figure 8:
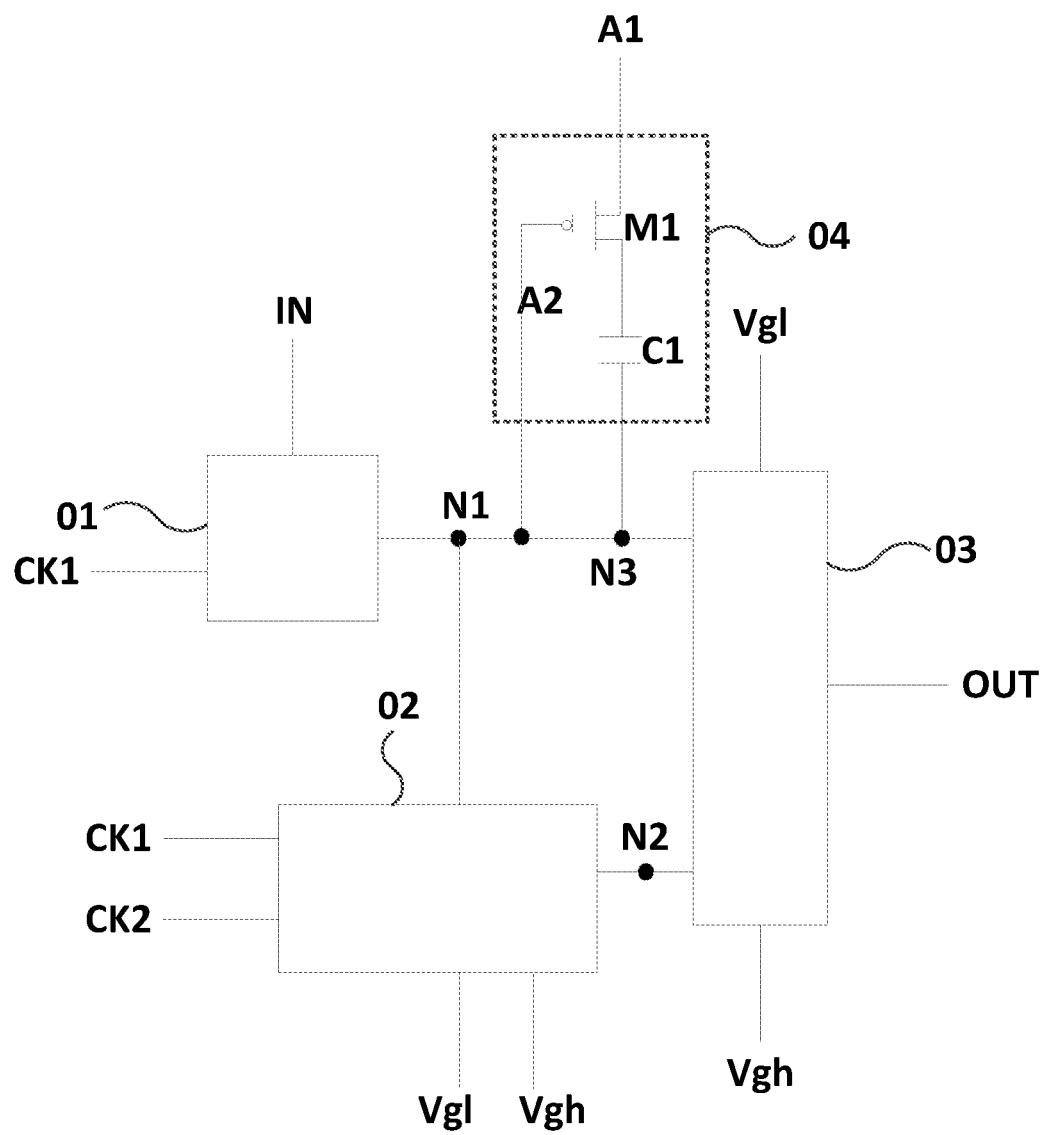
FIG. 8 is a structural diagram of another shift register of a display panel according to an embodiment of the present disclosure.

In an embodiment, the second control signal may further be set to be the signal of the first node. As shown in FIG. 8, the gate of the first transistor M1 is connected to the first node N1, and thus the second control signal A2 is the signal of the first node N1. When the first node N1 is at the low level, the first transistor M1 is on, and the first control signal A1 is transmitted to the first capacitor C1 so that the potential of the third node N3 is controlled to be lower than the potential of the first voltage signal Vgl within the first time period.

Figure 9:
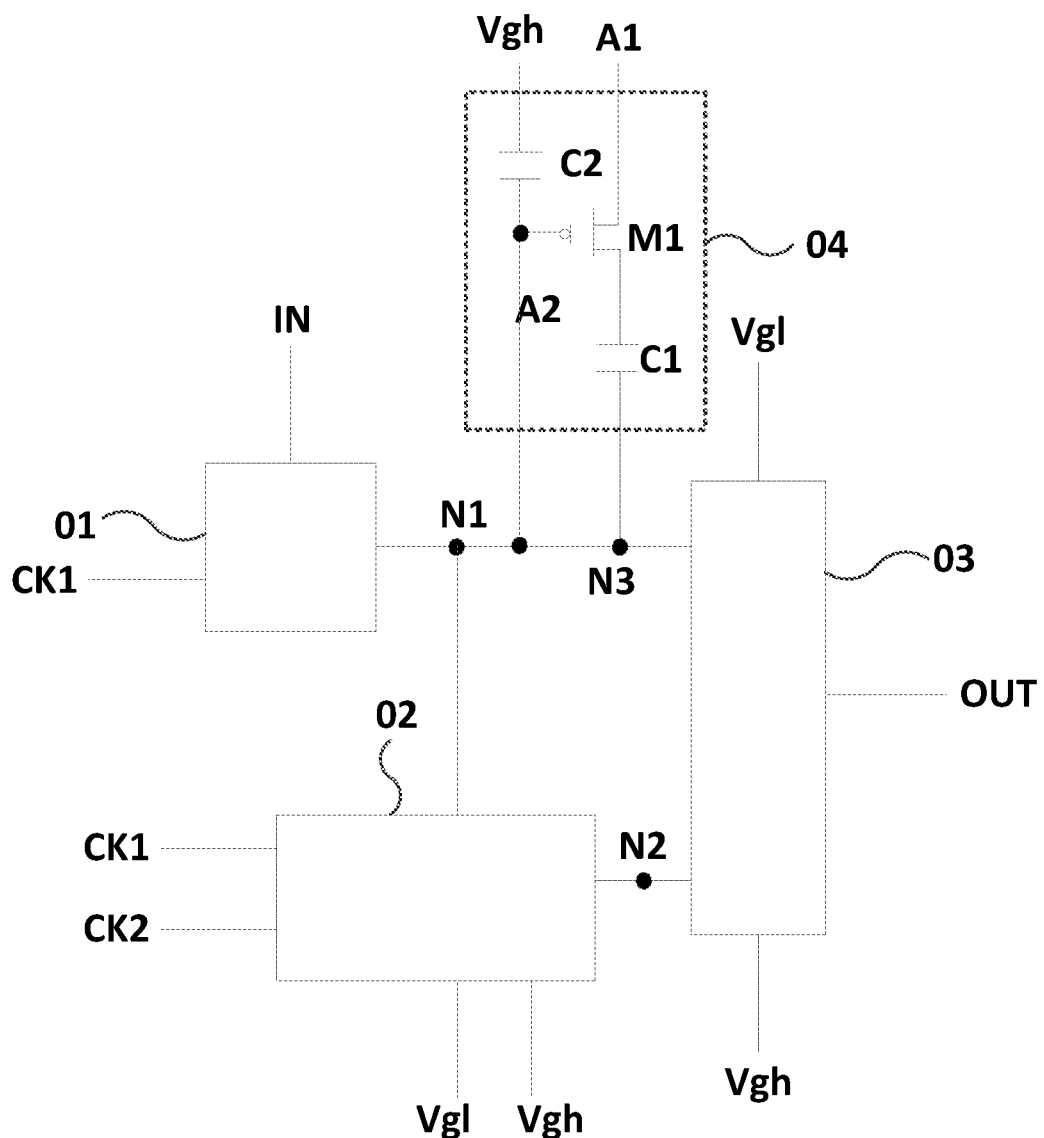
FIG. 9 is a structural diagram of another shift register of a display panel according to an embodiment of the present disclosure.

In an embodiment, the fourth control unit in this embodiment of the present disclosure may further include a second capacitor. The first plate of the second capacitor is connected to the gate of the first transistor, and the second plate of the second capacitor receives the second control signal. For example, as shown in FIG. 9, the fourth control unit 04 includes a second capacitor C2. The first plate of the second capacitor C2 is connected to the gate of the first transistor M1, and the second plate of the second capacitor C2 receives the second control signal Vgh. When the second control signal A2 is the signal of the first node N1, in this embodiment of the present disclosure, the potential of the first node N1 may be stabilized through the second voltage signal Vgh and the second capacitor C2 to prevent the floating of the potential of the first node N1 from affecting the potential of the third node N3.

In an embodiment, the capacitance value of the first capacitor is less than the capacitance value of the second capacitor. Since the first capacitor C1 is configured to control the pull-down of the potential of the third node, according to the relationship U=Q/C among the capacitance C, the charge Q, and the voltage U, it can be seen that, in the case where the charges are the same, a small capacitance value is required to make the voltage rapidly drop, and the smaller the capacitance is, the faster the pull-down speed of the potential of the third node is, the easier it is to improve the effect of reducing the tail phenomenon. Therefore, the first capacitor C1 requires a small capacitance value. The second capacitor C2 is mainly configured to stabilize the potential of the first node N1 and the potential of the third node N3. Therefore, the second capacitor C2 requires a large capacitance value to avoid causing a large change in the potential of the first node N1 in the process of charging and discharging the capacitor, thereby improving the stability of the node potential. Therefore, in this embodiment of the present disclosure, the capacitance value of the first capacitor is set to be less than the capacitance value of the second capacitor.

Figure 10:
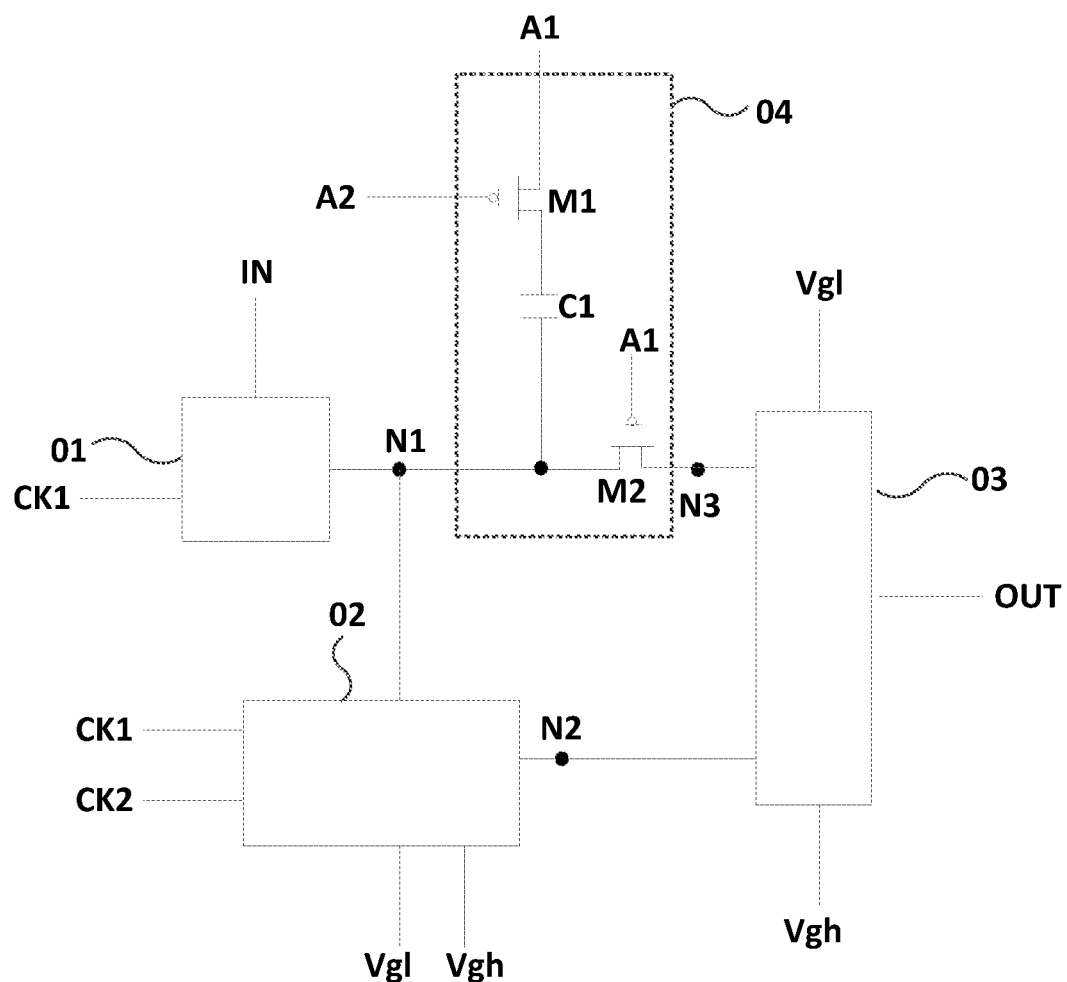
FIG. 10 is a structural diagram of another shift register of a display panel according to an embodiment of the present disclosure.

In an embodiment, the fourth control unit may further include a second transistor. The source of the second transistor is connected to the first node, the drain of the second transistor is connected to the third node, and the gate of the second transistor receives the first control signal, where the second control signal controls the first transistor to be on within the first time period. As shown in FIG. 10, the fourth control unit 04 includes a first capacitor C1, a first transistor M1, and a second transistor M2. The source of the first transistor M1 receives the first control signal A1, the drain of the first transistor M1 is connected to the third node N3, and the gate of the first transistor M1 receives the second control signal A2. The first capacitor C1 is located between the drain of the first transistor M1 and the third node N3. Within the first time period, the second control signal A2 controls the first transistor M1 to be on, and the first control signal A1 is a low level signal within the first time period. The source of the second capacitor M2 is connected to the first node N1, the drain of the second transistor M2 is connected to the third node N3, and the gate of the second transistor M2 receives the first control signal A1, where the first control signal A1 controls the second transistor M2 to be on within the first time period.

If the potential of the first node N1 is transmitted to the third node N3 before the first control signal A1 drops to the low level, the tailing problem of the shift register cannot be avoided. In this embodiment of the present disclosure, the second transistor M2 is provided between the first node N1 and the third node N3. Since the gate of the second transistor M2 receives the first control signal A1, only when the first control signal A1 is at the low level, the first transistor M1 is on and the second transistor M2 is on, is the pull-down of the potential of the third node N3 achieved so that the output signal tailing problem generated due to the direct transmission of the potential of the first node N1 to the third control unit 03 without the pull-down function of the fourth control unit 04 can be prevented.

Figure 11:
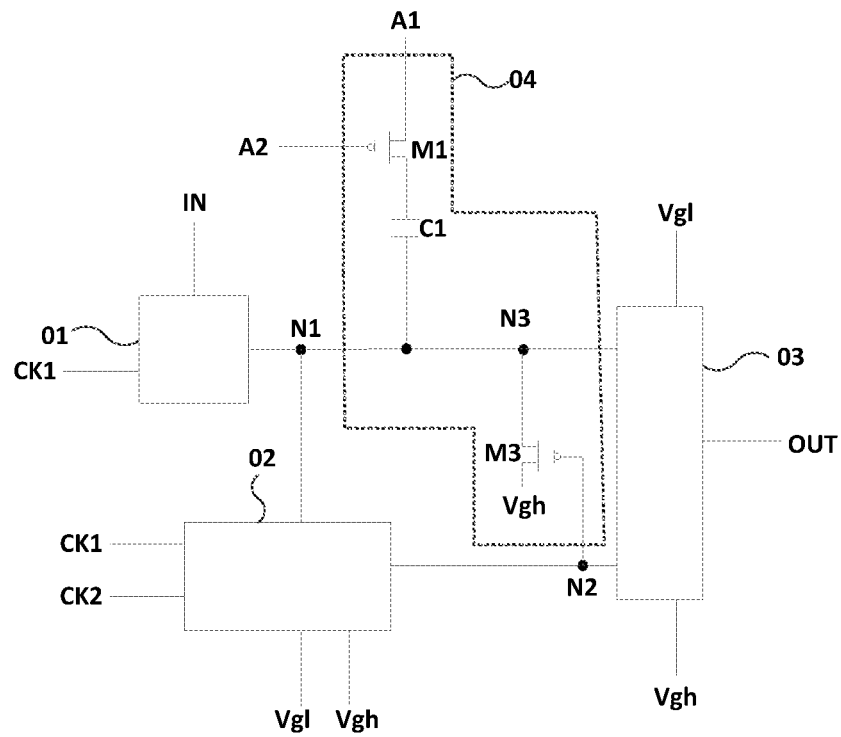
FIG. 11 is a structural diagram of another shift register of a display panel according to an embodiment of the present disclosure.

In an embodiment, the fourth control unit may further include a third capacitor. The source of the third capacitor receives the second voltage signal, the drain of the third transistor is connected to the third node, and the gate of the third transistor is connected to the second node, where the second node controls the third transistor to be off within the first time period. For example, as shown in FIG. 11, the fourth control unit 04 includes a first capacitor C1, a first transistor M1, and a third transistor M3. The source of the first transistor M1 receives the first control signal A1, the drain of the first transistor M1 is connected to the third node N3, and the gate of the first transistor M1 receives the second control signal A2. The first capacitor C1 is located between the drain of the first transistor M1 and the third node N3. Within the first time period, the second control signal A2 controls the first transistor M1 to be on, and the first control signal A1 is a low level signal within the first time period. The source of the third capacitor M3 receives the second voltage signal Vgh, the drain of the third transistor M3 is connected to the third node N3, and the gate of the third transistor M3 is connected to the second node N2, where the second node N2 controls the third transistor M3 to be off within the first time period.

Since each clock signal in the shift register is subjected to multiple transitions, the potential of the first node N1 and the potential of the third node N3 float in the transition process. In this embodiment of the present disclosure, the third transistor M3 is provided, and the potential of the third node N3 is controlled by the potential of the second node N2 to ensure the signal stability when the third node N3 is at the high level. For example, if the shift register is required to output a high level (the second voltage signal Vgh), the second node N2 is at a low potential, and the third node N3 is required to remain at a stable high potential. In this embodiment of the present disclosure, the third transistor M3 is provided, the gate of the third transistor M3 is connected to the second node N2, the second node N2 is at a low potential, and the third transistor M3 is on so that the third node N3 is stably remained at the high potential of the second voltage signal Vgh, thereby ensuring that the level of the third node N3 does not change until the second node N2 becomes a high level. Only when the second node N2 becomes a high level can the third node N3 become a low level signal lower than the first voltage signal Vgl, thereby reducing the tailing phenomenon.

In an embodiment, the first control unit may include a fourth transistor. The source of the fourth transistor receives the input signal, the drain of the fourth transistor is connected to the first node, and the gate of the fourth transistor receives the first clock signal. The second control unit includes a fifth transistor, a sixth transistor, a seventh transistor, an eighth transistor, a ninth transistor, a third capacitor, and a fourth capacitor. The source of the fifth transistor receives the first clock signal, the drain of the fifth transistor is connected to a fourth node, and the gate of the fifth transistor is connected to the first node. The source of the sixth transistor receives the second clock signal, the drain of the sixth transistor is connected to a fifth node, and the gate of the sixth transistor is connected to the fourth node. The source of the seventh transistor receives the first voltage signal, the drain of the seventh transistor is connected to the fourth node, and the gate of the seventh transistor receives the first clock signal. The source of the eighth transistor receives the second voltage signal, the drain of the eighth transistor is connected to the second node, and the gate of the eighth transistor is connected to the first node. The source of the ninth transistor is connected to the fifth node, the drain of the ninth transistor is connected to the second node, and the gate of the ninth transistor receives the second clock signal. The first plate of the third capacitor is connected to the fourth node, and the second plate of the third capacitor is connected to the fifth node. The first plate of the fourth capacitor receives the second voltage signal, and the second plate of the fourth capacitor is connected to the second node. The third control unit includes a tenth transistor, an eleventh transistor, and a fourth capacitor. The source of the tenth transistor receives the first voltage signal, the drain of the tenth transistor outputs an output signal, and the gate of the tenth transistor is connected to the third node. The source of the eleventh transistor receives the second voltage signal, the drain of the eleventh transistor outputs an output signal, and the gate of the eleventh transistor is connected to the second node.

Figure 12:
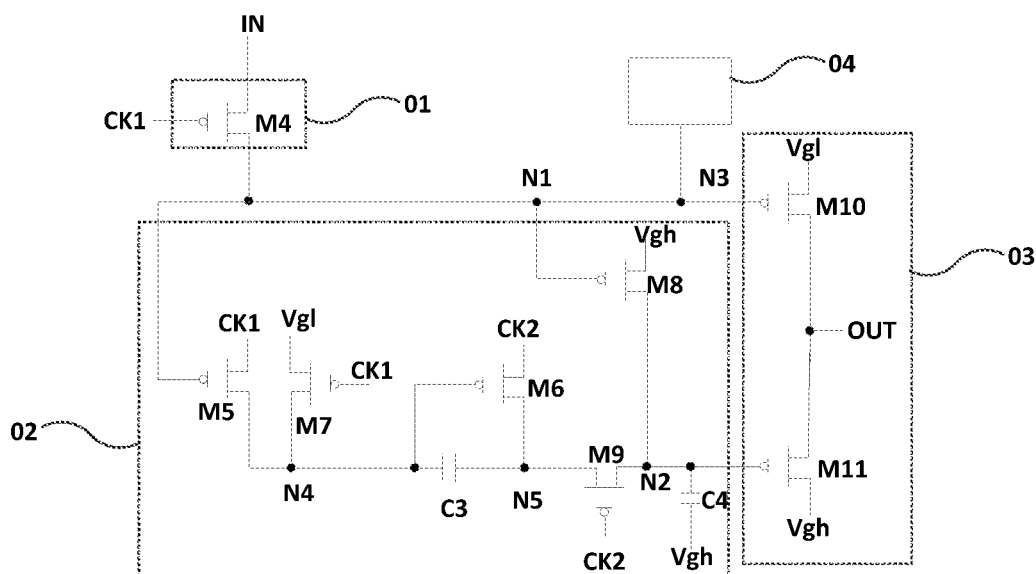
FIG. 12 is a structural diagram of another shift register of a display panel according to an embodiment of the present disclosure.

For example, with reference to FIG. 12, the first control unit 01 may include a fourth transistor M4. The source of the fourth transistor M4 receives the input signal IN, the drain of the fourth transistor M4 is connected to the first node N1, and the gate of the fourth transistor M4 receives the first clock signal CK1. The second control unit 02 includes a fifth transistor M5, a sixth transistor M6, a seventh transistor M7, an eighth transistor M8, a ninth transistor M9, a third capacitor C3, and a fourth capacitor C4. The source of the fifth transistor M5 receives the first clock signal CK1, the drain of the fifth transistor M5 is connected to a fourth node N4, and the gate of the fifth transistor M5 is connected to the first node N1. The source of the sixth transistor M6 receives the second clock signal CK2, the drain of the sixth transistor M6 is connected to a fifth node N5, and the gate of the sixth transistor M6 is connected to the fourth node N4. The source of the seventh transistor M7 receives the first voltage signal Vgl, the drain of the seventh transistor M7 is connected to the fourth node N4, and the gate of the seventh transistor M7 receives the first clock signal CK1. The source of the eighth transistor M8 receives the second voltage signal Vgh, the drain of the eighth transistor M8 is connected to the second node N2, and the gate of the eighth transistor M8 is connected to the first node N1. The source of the ninth transistor M9 is connected to the fifth node N5, the drain of the ninth transistor M9 is connected to the second node N2, and the gate of the ninth transistor M9 receives the second clock signal CK2. The first plate of the third capacitor C3 is connected to the fourth node N4, and the second plate of the third capacitor C3 is connected to the fifth node N5. The first plate of the fourth capacitor C4 receives the second voltage signal Vgh, and the second plate of the fourth capacitor C4 is connected to the second node N2. The third control unit 03 includes a tenth transistor M10, an eleventh transistor M11, and a fourth capacitor C4. The source of the tenth transistor M10 receives the first voltage signal Vgl, the drain of the tenth transistor M10 outputs an output signal OUT, and the gate of the tenth transistor M10 is connected to the third node N3. The source of the eleventh transistor M11 receives the second voltage signal Vgh, the drain of the eleventh transistor M11 outputs an output signal OUT, and the gate of the eleventh transistor M11 is connected to the second node N2.

In an embodiment, the capacitance value of the first capacitor C1 is less than the capacitance value of the third capacitor C3, or the capacitance value of the first capacitor C1 is less than the capacitance value of the fourth capacitor C4. Since the first capacitor C1 is configured to control the pull-down of the potential of the third node N3, the smaller the capacitance is, the faster the pull-down speed of the potential of the third node N3 is, the easier it is to improve the effect of reducing the tail phenomenon. Therefore, the capacitance value of the first capacitor C1 is set to be less than the capacitance value of the third capacitor C3, or the capacitance value of the first capacitor C1 is set to be less than the capacitance value of the fourth capacitor C4. The third capacitor C3 is mainly configured to stabilize the potential of the fourth node N4, and the fourth capacitor C4 is configured to stabilize the potential of the second node N2. Therefore, the capacitance value of both the third capacitor C3 and the fourth capacitor C4 is set to be larger than the capacitance value of the first capacitor C1.

Figure 13:
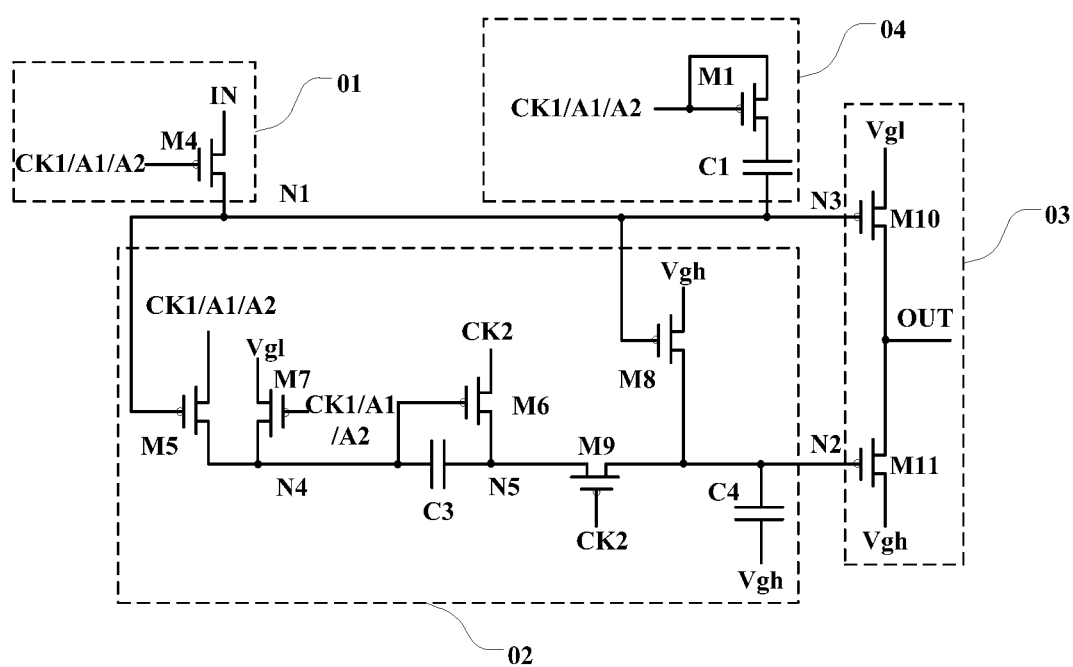
FIG. 13 is a structural diagram of another shift register of a display panel according to an embodiment of the present disclosure.
Figure 14:
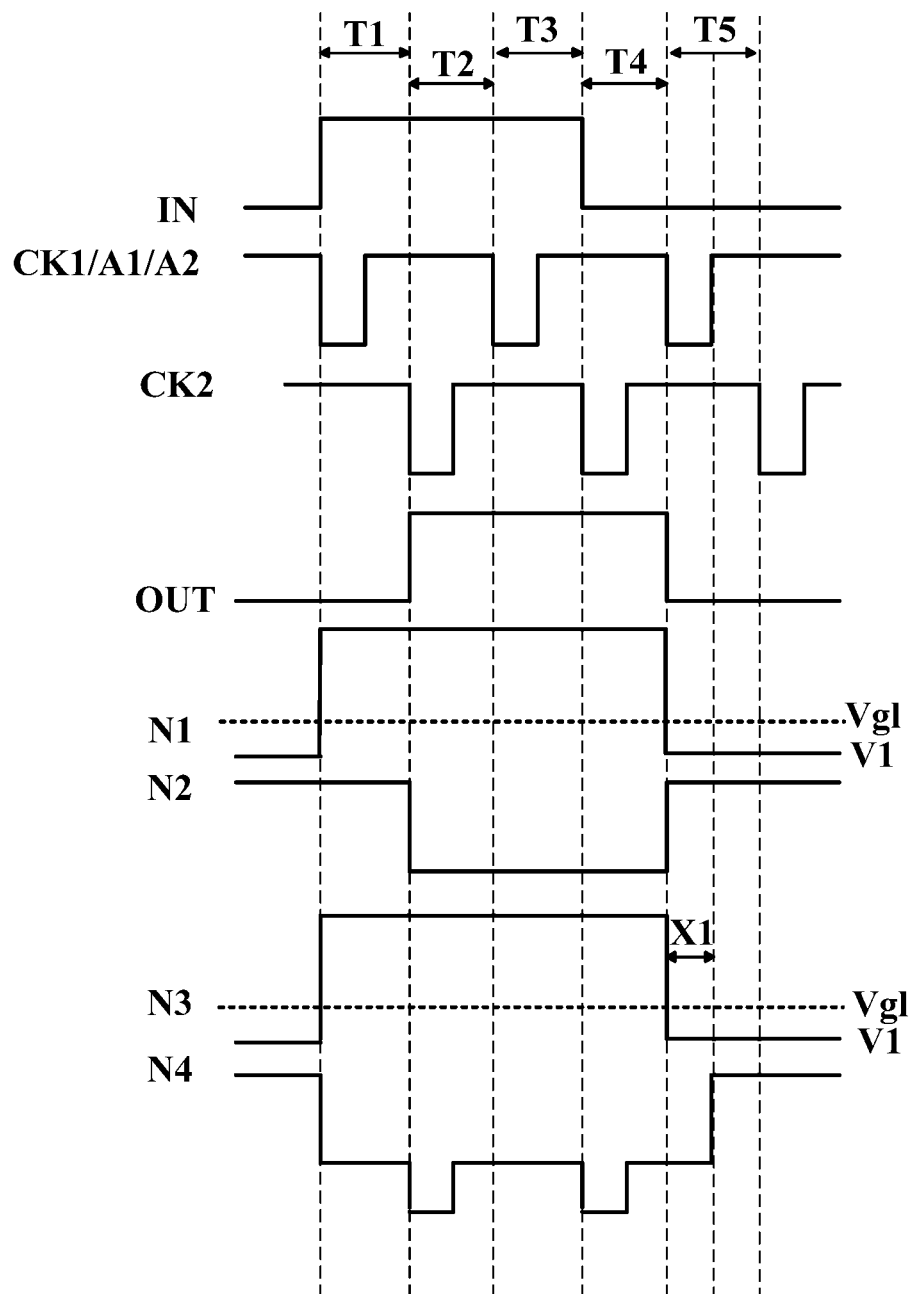
FIG. 14 is a timing diagram of the circuit structure shown in FIG. 13.

The specific implementation principle of the present disclosure will be described in detail below with reference to several specific examples of the circuit structure of the shift register. FIG. 13 is a schematic diagram of the circuit structure of another shift register according to an embodiment of the present disclosure. As shown in FIG. 13, the first control unit 01 includes a fourth transistor M4. The source of the fourth transistor M4 receives the input signal IN, the drain of the fourth transistor M4 is connected to the first node N1, and the gate of the fourth transistor M4 receives the first clock signal CK1. The second control unit 02 includes a fifth transistor M5, a sixth transistor M6, a seventh transistor M7, an eighth transistor M8, a ninth transistor M9, a third capacitor C3, and a fourth capacitor C4. The source of the fifth transistor M5 receives the first clock signal CK1, the drain of the fifth transistor M5 is connected to the fourth node N4, and the gate of the fifth transistor M5 is connected to the first node N1. The source of the sixth transistor M6 receives the second clock signal CK2, the drain of the sixth transistor M6 is connected to the fifth node N5, and the gate of the sixth transistor M6 is connected to the fourth node N4. The source of the seventh transistor M7 receives the first voltage signal Vgl, the drain of the seventh transistor M7 is connected to the fourth node N4, and the gate of the seventh transistor M7 receives the first clock signal CK1. The source of the eighth transistor M8 receives the second voltage signal Vgh, the drain of the eighth transistor M8 is connected to the second node N2, and the gate of the eighth transistor M8 is connected to the first node N1. The source of the ninth transistor M9 is connected to the fifth node N5, the drain of the ninth transistor M9 is connected to the second node N2, and the gate of the ninth transistor M9 receives the second clock signal CK2. The first plate of the third capacitor C3 is connected to the fourth node N4, and the second plate of the third capacitor C3 is connected to the fifth node N5. The first plate of the fourth capacitor C4 receives the second voltage signal Vgh, and the second plate of the fourth capacitor C4 is connected to the second node N2. The third control unit 03 includes a tenth transistor M10, an eleventh transistor M11, and a fourth capacitor C4. The source of the tenth transistor M10 receives the first voltage signal Vgl, the drain of the tenth transistor M10 outputs the output signal OUT, and the gate of the tenth transistor M10 is connected to the third node N3. The source of the eleventh transistor M11 receives the second voltage signal Vgh, the drain of the eleventh transistor M11 outputs the output signal OUT, and the gate of the eleventh transistor M11 is connected to the second node N2. The fourth control unit 04 includes a first capacitor C1. The first plate of the first capacitor C1 is connected to the third node N3, and the second plate of the first capacitor C1 receives the first control signal A1. The fourth control unit 04 includes a first transistor M1. The source of the first transistor M1 receives the first control signal A1, the drain of the first transistor M1 is connected to the second plate of the first capacitor C1, and the gate of the first transistor M1 receives the second control signal A2. In this embodiment, the first clock signal, the first control signal A1, and the second control signal A2 are the same signal. Within the first time period, the first control signal A1 is a low level signal, and the second control signal A2 controls the first transistor M1 to be on. FIG. 14 is a timing diagram of the circuit structure shown in FIG. 13. The timing will be described in detail below with reference to FIGS. 13 and 14.

At the first stage T1, the input signal IN is at a high level, the first clock signal CK1 is at a low level, the fourth transistor M4 is on, the first node N1 is at a high level, and the third node N3 is at a high level. The seventh transistor M7 is on, and the fourth node N4 is at a low level. The second clock signal CK2 is at a high level, the second node N2 remains at a high level, the eleventh transistor M11 is off, and the output signal OUT remains at a low level.

At the second stage T2, the input signal IN is at a high level, the first clock signal CK1 is at a high level, the fourth transistor M4 is off, the first node N1 remains at a high level, and the third node N3 remains at a high level. The fourth node N4 remains at a low level, the second clock signal CK2 is at a low level, the sixth transistor M6 and the ninth transistor M9 are on, the second node N2 becomes at a low level, the eleventh transistor M11 is on, and the output signal OUT becomes at a high level.

At the third stage T3, the input signal IN is at a high level, the first clock signal CK1 is at a low level, the first node N1 is at a high level, the third node N3 is at a high level, the seventh transistor M7 is on, the fourth node N4 is at a low level, the second clock signal CK2 is at a high level, the sixth transistor M6 is on, the fifth node N5 is at a high level, the ninth transistor M9 is off, the second node N2 remains at a low level, the eleventh transistor M11 is on, and the output signal OUT remains at a high level.

At the fourth stage T4, the input signal IN is at a low level, the first clock signal CK1 is at a high level, the first node N1 remains at a high level, the third node N3 remains at a high level, the fourth node N4 remains at a low level, the second clock signal CK2 is at a low level, the second node N2 is at a low level, and the output signal OUT remains at a high level.

At the fifth stage T5, the input signal IN is at a low level, the first clock signal CK1 is at a low level, and the first node N1 is at a low level. Within the first time period X1, the first transistor M1 is on, and the first capacitor C1 is rapidly charged so that the potential of the third node N3 rapidly drops to the first low level signal V1. The fourth node N4 is at a low level, the second clock signal CK2 is at a high level, and the second node N2 is at a high level. Since the potential of the first low level signal V1 is lower than the potential of the first voltage signal Vgl and the potential of the gate of the tenth transistor M10 is less than the potential of the source of the tenth transistor M10, the tenth transistor M10 can rapidly approach the saturation state, the tenth transistor M10 is on, the eleventh transistor M11 is off, and the output signal OUT of the shift register substantially coincides with the first voltage signal Vgl, thereby avoiding the tailing phenomenon of the output signal.

Figure 15:
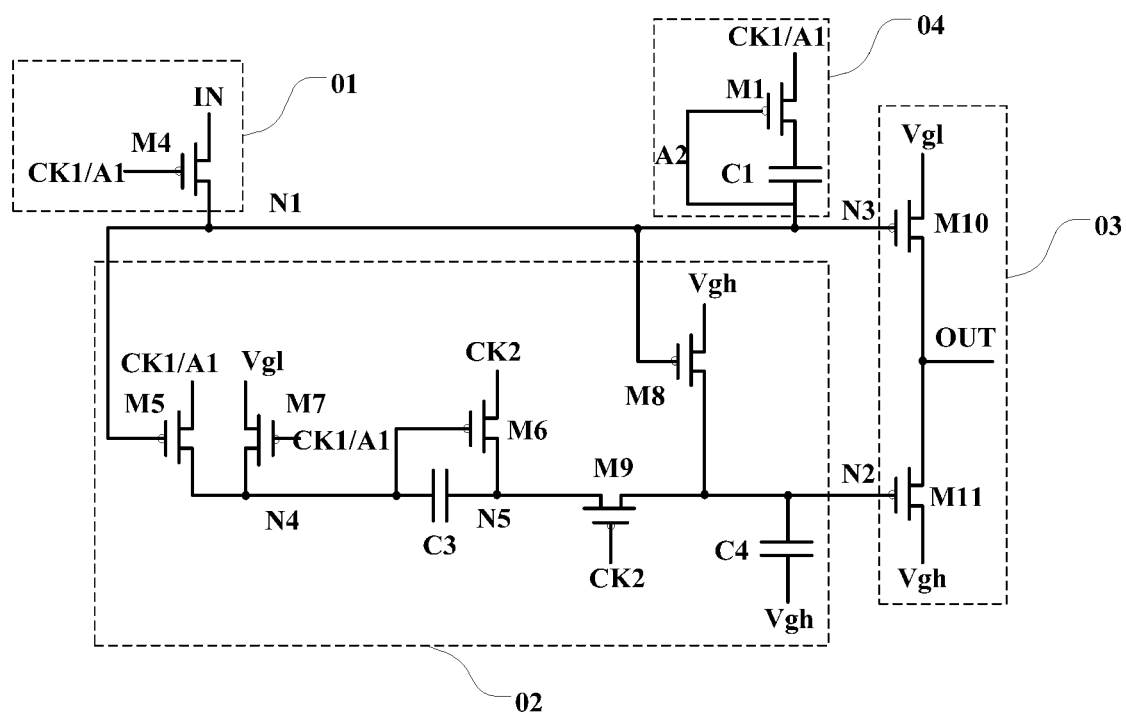
FIG. 15 is a structural diagram of another shift register of a display panel according to an embodiment of the present disclosure.
Figure 16:
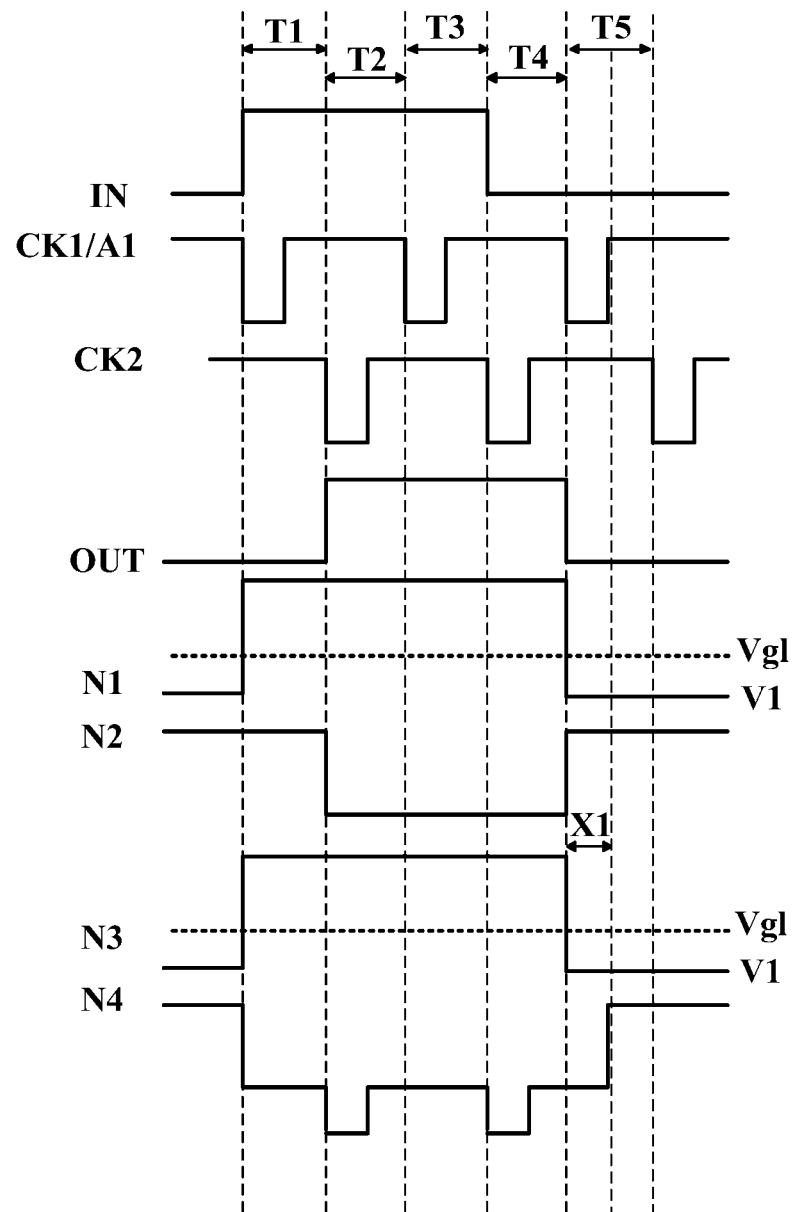
FIG. 16 is a timing diagram of the circuit structure shown in FIG. 15.

FIG. 15 is a schematic diagram of the circuit structure of another shift register according to an embodiment of the present disclosure. As shown in FIG. 15, the first control unit 01 includes a fourth transistor M4. The source of the fourth transistor M4 receives the input signal IN, the drain of the fourth transistor M4 is connected to the first node N1, and the gate of the fourth transistor M4 receives the first clock signal CK1. The second control unit 02 includes a fifth transistor M5, a sixth transistor M6, a seventh transistor M7, an eighth transistor M8, a ninth transistor M9, a third capacitor C3, and a fourth capacitor C4. The source of the fifth transistor M5 receives the first clock signal CK1, the drain of the fifth transistor M5 is connected to the fourth node N4, and the gate of the fifth transistor M5 is connected to the first node N1. The source of the sixth transistor M6 receives the second clock signal CK2, the drain of the sixth transistor M6 is connected to the fifth node N5, and the gate of the sixth transistor M6 is connected to the fourth node N4. The source of the seventh transistor M7 receives the first voltage signal Vgl, the drain of the seventh transistor M7 is connected to the fourth node N4, and the gate of the seventh transistor M7 receives the first clock signal CK1. The source of the eighth transistor M8 receives the second voltage signal Vgh, the drain of the eighth transistor M8 is connected to the second node N2, and the gate of the eighth transistor M8 is connected to the first node N1. The source of the ninth transistor M9 is connected to the fifth node N5, the drain of the ninth transistor M9 is connected to the second node N2, and the gate of the ninth transistor M9 receives the second clock signal CK2. The first plate of the third capacitor C3 is connected to the fourth node N4, and the second plate of the third capacitor C3 is connected to the fifth node N5. The first plate of the fourth capacitor C4 receives the second voltage signal Vgh, and the second plate of the fourth capacitor C4 is connected to the second node N2. The third control unit 03 includes a tenth transistor M10, an eleventh transistor M11, and a fourth capacitor C4. The source of the tenth transistor M10 receives the first voltage signal Vgl, the drain of the tenth transistor M10 outputs the output signal OUT, and the gate of the tenth transistor M10 is connected to the third node N3. The source of the eleventh transistor M11 receives the second voltage signal Vgh, the drain of the eleventh transistor M11 outputs the output signal OUT, and the gate of the eleventh transistor M11 is connected to the second node N2. The fourth control unit 04 includes a first capacitor C1. The first plate of the first capacitor C1 is connected to the third node N3, and the second plate of the first capacitor C1 receives the first control signal A1. The fourth control unit 04 includes a first transistor M1. The source of the first transistor M1 receives the first control signal A1, the drain of the first transistor M1 is connected to the second plate of the first capacitor C1, and the gate of the first transistor M1 receives the second control signal A2. In this embodiment, the second control signal A2 is the signal of the first node N1. The first clock CK1 and the first control signal A1 are the same signal. Within the first time period, the first control signal A1 is a low level signal, and the second control signal A2 controls the first transistor M1 to be on. FIG. 16 is a timing diagram of the circuit structure shown in FIG. 16. The timing will be described in detail below with reference to FIGS. 15 and 16.

At the first stage T1, the input signal IN is at a high level, the first clock signal CK1 is at a low level, the fourth transistor M4 is on, the first node N1 is at a high level, the third node N3 is at a high level, the seventh transistor M7 is on, and the fourth node N4 is at a low level. The second clock signal CK2 is at a high level, the second node N2 remains at a high level, the eleventh transistor M11 is off, and the output signal OUT remains at a low level.

At the second stage T2, the input signal IN is at a high level, the first clock signal CK1 is at a high level, the fourth transistor M4 is off, the first node N1 remains at a high level, and the third node N3 remains at a high level. The fourth node N4 remains at a low level, the second clock signal CK2 is at a low level, the sixth transistor M6 and the ninth transistor M9 are on, the second node N2 becomes at a low level, the eleventh transistor M11 is on, and the output signal OUT becomes at a high level.

At the third stage T3, the input signal IN is at a high level, the first clock signal CK1 is at a low level, the first node N1 is at a high level, the third node N3 is at a high level, the seventh transistor M7 is on, the fourth node N4 is at a low level, the second clock signal CK2 is at a high level, the sixth transistor M6 is on, the fifth node N5 is at a high level, the ninth transistor M9 is off, the second node N2 remains at a low level, the eleventh transistor M11 is on, and the output signal OUT remains at a high level.

At the fourth stage T4, the input signal IN is at a low level, the first clock signal CK1 is at a high level, the first node N1 remains at a high level, the third node N3 remains at a high level, the fourth node N4 remains at a low level, the second clock signal CK2 is at a low level, the second node N2 is at a low level, and the output signal OUT remains at a high level.

At the fifth stage T5, the input signal IN is at a low level, the first clock signal CK1 is at a low level, the first node N1 is at a low level, and the gate of the first transistor M1 is connected to the first node N1. Therefore, within the first time period X1, the first transistor M1 is on, and the first capacitor C1 is rapidly charged so that the potential of the third node N3 rapidly drops to the potential of the first low level signal V1. The fourth node N4 is at a low level, the second clock signal CK2 is at a high level, and the second node N2 is at a high level. Since the potential of the first low level signal V1 is lower than the potential of the first voltage signal Vgl and the potential of the gate of the tenth transistor M10 is less than the potential of the source of the tenth transistor M10, the tenth transistor M10 can rapidly approach the saturation state, the tenth transistor M10 is on, the eleventh transistor M11 is off, and the output signal OUT of the shift register substantially coincides with the first voltage signal Vgl, thereby avoiding the tailing phenomenon of the output signal.

Figure 17:
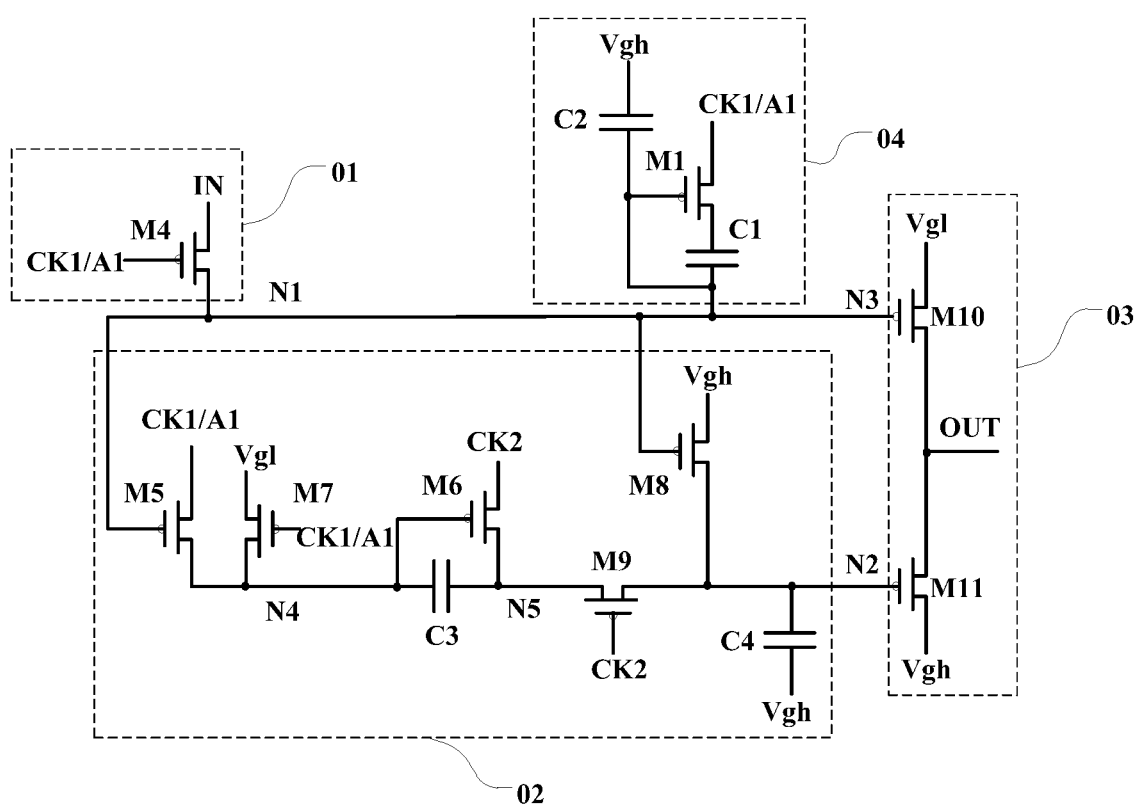
FIG. 17 is a structural diagram of another shift register of a display panel according to an embodiment of the present disclosure.
Figure 18:
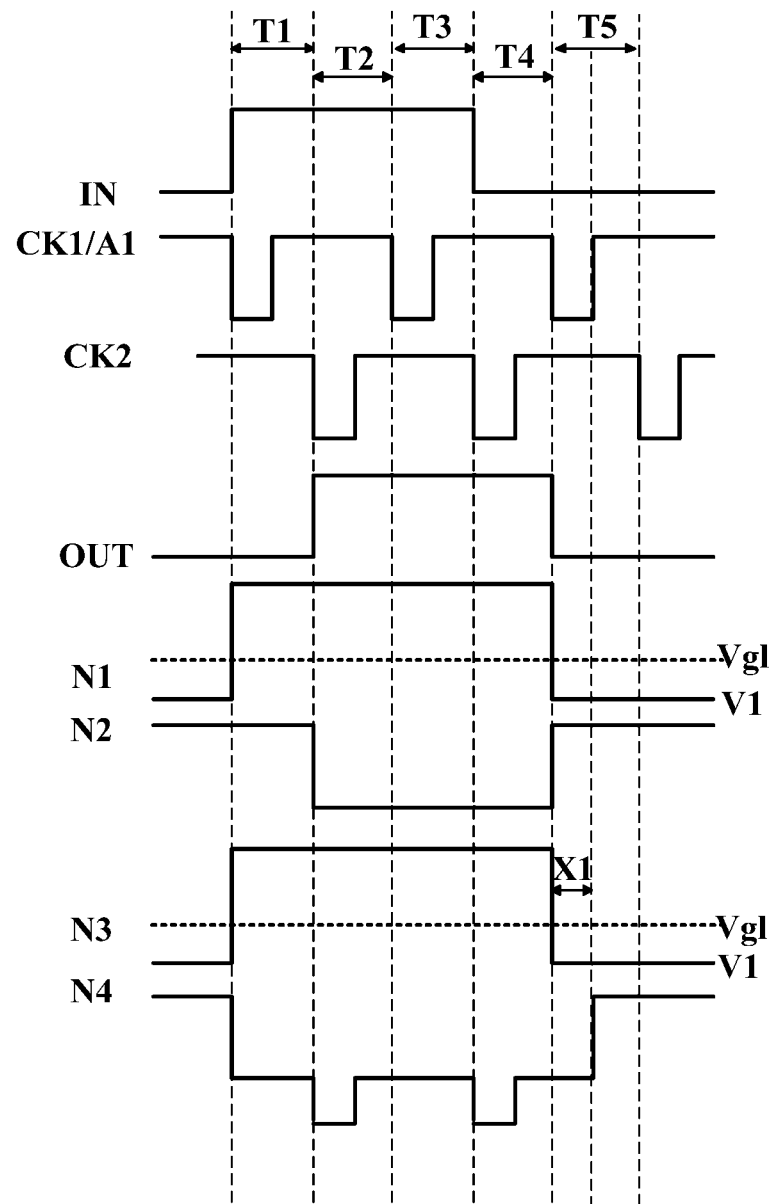
FIG. 18 is a timing diagram of the circuit structure shown in FIG. 17.

FIG. 17 is a schematic diagram of the circuit structure of another shift register according to an embodiment of the present disclosure. As shown in FIG. 17, the first control unit 01 includes a fourth transistor M4. The source of the fourth transistor M4 receives the input signal IN, the drain of the fourth transistor M4 is connected to the first node N1, and the gate of the fourth transistor M4 receives the first clock signal CK1. The second control unit 02 includes a fifth transistor M5, a sixth transistor M6, a seventh transistor M7, an eighth transistor M8, a ninth transistor M9, a third capacitor C3, and a fourth capacitor C4. The source of the fifth transistor M5 receives the first clock signal CK1, the drain of the fifth transistor M5 is connected to the fourth node N4, and the gate of the fifth transistor M5 is connected to the first node N1. The source of the sixth transistor M6 receives the second clock signal CK2, the drain of the sixth transistor M6 is connected to the fifth node N5, and the gate of the sixth transistor M6 is connected to the fourth node N4. The source of the seventh transistor M7 receives the first voltage signal Vgl, the drain of the seventh transistor M7 is connected to the fourth node N4, and the gate of the seventh transistor M7 receives the first clock signal CK1. The source of the eighth transistor M8 receives the second voltage signal Vgh, the drain of the eighth transistor M8 is connected to the second node N2, and the gate of the eighth transistor M8 is connected to the first node N1. The source of the ninth transistor M9 is connected to the fifth node N5, the drain of the ninth transistor M9 is connected to the second node N2, and the gate of the ninth transistor M9 receives the second clock signal CK2. The first plate of the third capacitor C3 is connected to the fourth node N4, and the second plate of the third capacitor C3 is connected to the fifth node N5. The first plate of the fourth capacitor C4 receives the second voltage signal Vgh, and the second plate of the fourth capacitor C4 is connected to the second node N2. The third control unit 03 includes a tenth transistor M10, an eleventh transistor M11, and a fourth capacitor C4. The source of the tenth transistor M10 receives the first voltage signal Vgl, the drain of the tenth transistor M10 outputs the output signal OUT, and the gate of the tenth transistor M10 is connected to the third node N3. The source of the eleventh transistor M11 receives the second voltage signal Vgh, the drain of the eleventh transistor M11 outputs the output signal OUT, and the gate of the eleventh transistor M11 is connected to the second node N2. The fourth control unit 04 includes a first capacitor C1, a first transistor, and a second capacitor C2. The first plate of the first capacitor C1 is connected to the third node N3, and the second plate of the first capacitor C1 receives the first control signal A1. The source of the first transistor M1 receives the first control signal A1, the drain of the first transistor M1 is connected to the second plate of the first capacitor C1, and the gate of the first transistor M1 receives the second control signal A2. The first plate of the second capacitor C2 is connected to the gate of the first transistor M1, and the second plate of the second capacitor C2 receives the second voltage signal Vgh. The gate of the first transistor M1 is connected to the first node N1, that is, the second control signal A2 is a potential signal of the first node N1. In this embodiment, the first clock CK1 and the first control signal A1 are the same signal. Within the first time period, the first control signal A1 is a low level signal, and the second control signal A2 controls the first transistor M1 to be on. FIG. 18 is a timing diagram of the circuit structure shown in FIG. 17. The timing will be described in detail below with reference to FIGS. 17 and 18.

At the first stage T1, the input signal IN is at a high level, the first clock signal CK1 is at a low level, the fourth transistor M4 is on, the first node N1 is at a high level, the third node N3 is at a high level, the seventh transistor M7 is on, and the fourth node N4 is at a low level. The second clock signal CK2 is at a high level, the second node N2 remains at a high level, the eleventh transistor M11 is off, and the output signal OUT remains at a low level.

At the second stage T2, the input signal IN is at a high level, the first clock signal CK1 is at a high level, the fourth transistor M4 is off, the first node N1 remains at a high level, and the third node N3 remains at a high level. The fourth node N4 remains at a low level, the second clock signal CK2 is at a low level, the sixth transistor M6 and the ninth transistor M9 are on, the second node N2 becomes at a low level, the eleventh transistor M11 is on, and the output signal OUT becomes at a high level.

At the third stage T3, the input signal IN is at a high level, the first clock signal CK1 is at a low level, the first node N1 is at a high level, the third node N3 is at a high level, the seventh transistor M7 is on, the fourth node N4 is at a low level, the second clock signal CK2 is at a high level, the sixth transistor M6 is on, the fifth node N5 is at a high level, the ninth transistor M9 is off, the second node N2 remains at a low level, the eleventh transistor M11 is on, and the output signal OUT remains at a high level.

At the fourth stage T4, the input signal IN is at a low level, the first clock signal CK1 is at a high level, the first node N1 remains at a high level, the third node N3 remains at a high level, the fourth node N4 remains at a low level, the second clock signal CK2 is at a low level, the second node N2 is at a low level, and the output signal OUT remains at a high level.

At the fifth stage T5, the input signal IN is at a low level, the first clock signal CK1 is at a low level, and the first node N1 is at a low level. Within the first time period X1, the gate of the first transistor M1 is connected to the first node N1. Therefore, the first transistor M1 is on, and the first capacitor C1 is rapidly charged so that the potential of the third node N3 rapidly drops to the potential of the first low level signal V1. The fourth node N4 is at a low level, the second clock signal CK2 is at a high level, and the second node N2 is at a high level. Since the potential of the first low level signal V1 is lower than the potential of the first voltage signal Vgl and the potential of the gate of the tenth transistor M10 is less than the potential of the source of the tenth transistor M10, the tenth transistor M10 can rapidly approach the saturation state, the tenth transistor M10 is on, the eleventh transistor M11 is off, and the output signal OUT of the shift register substantially coincides with the first voltage signal Vgl, thereby avoiding the tailing phenomenon of the output signal. The fourth control unit 04 in this embodiment of the present disclosure is provided with a second capacitor C2. The potential of the first node N1 may be stabilized by the second voltage signal Vgh and the second capacitor C2 so that the floating of the potential of the first node N1 is prevented from affecting the potential of the third node N3 and thus affecting the output signal OUT of the shift register.

Figure 19:
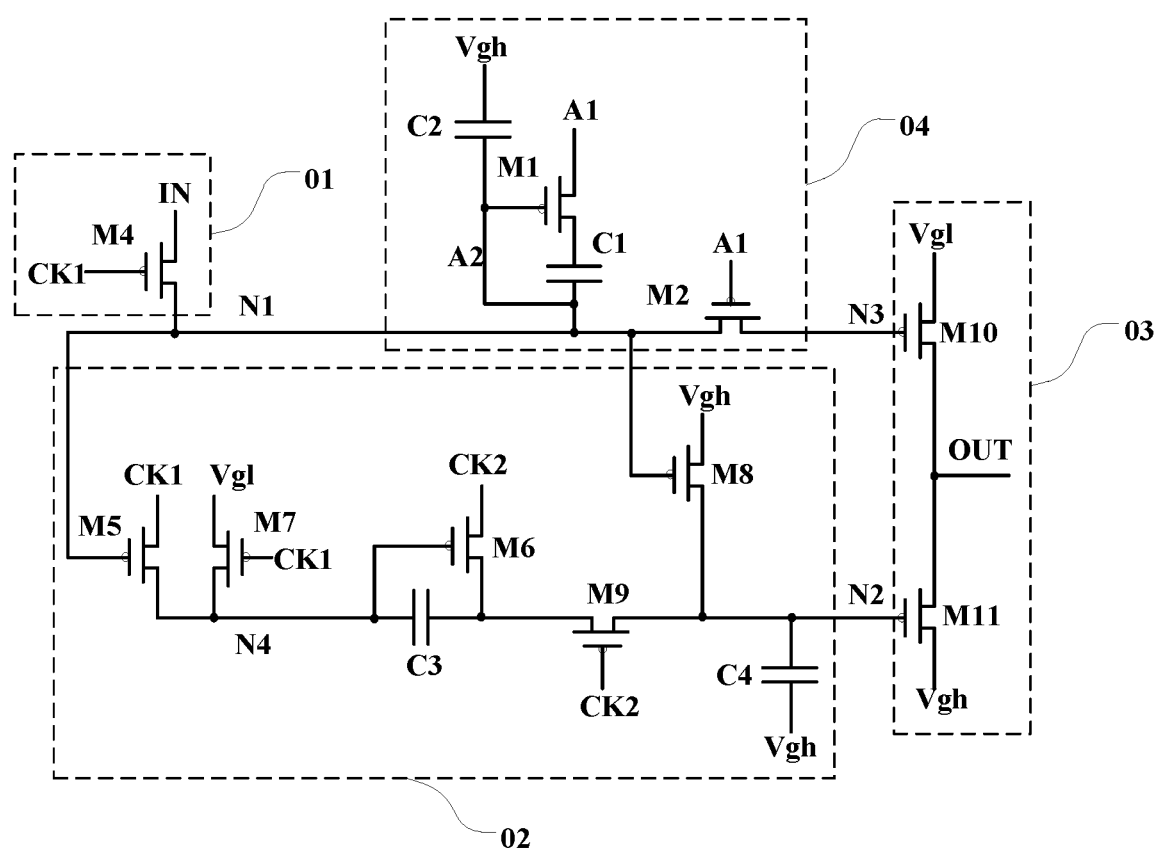
FIG. 19 is a structural diagram of another shift register of a display panel according to an embodiment of the present disclosure.
Figure 20:
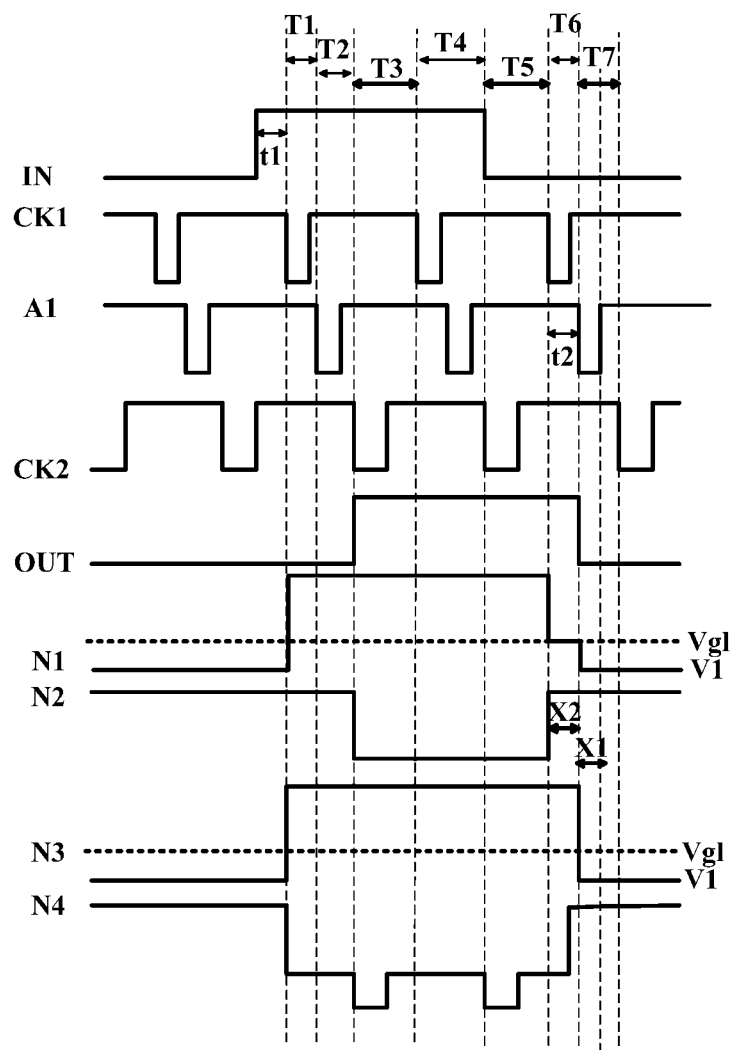
FIG. 20 is a timing diagram of the circuit structure shown in FIG. 19.

FIG. 19 is a schematic diagram of the circuit structure of another shift register according to an embodiment of the present disclosure. As shown in FIG. 19, the first control unit 01 includes a fourth transistor M4. The source of the fourth transistor M4 receives the input signal IN, the drain of the fourth transistor M4 is connected to the first node N1, and the gate of the fourth transistor M4 receives the first clock signal CK1. The second control unit 02 includes a fifth transistor M5, a sixth transistor M6, a seventh transistor M7, an eighth transistor M8, a ninth transistor M9, a third capacitor C3, and a fourth capacitor C4. The source of the fifth transistor M5 receives the first clock signal CK1, the drain of the fifth transistor M5 is connected to the fourth node N4, and the gate of the fifth transistor M5 is connected to the first node N1. The source of the sixth transistor M6 receives the second clock signal CK2, the drain of the sixth transistor M6 is connected to the fifth node N5, and the gate of the sixth transistor M6 is connected to the fourth node N4. The source of the seventh transistor M7 receives the first voltage signal Vgl, the drain of the seventh transistor M7 is connected to the fourth node N4, and the gate of the seventh transistor M7 receives the first clock signal CK1. The source of the seventh transistor M7 receives the first voltage signal Vgl, the drain of the seventh transistor M7 is connected to the fourth node N4, and the gate of the seventh transistor M7 receives the first clock signal CK1. The source of the eighth transistor M8 receives the second voltage signal Vgh, the drain of the eighth transistor M8 is connected to the second node N2, and the gate of the eighth transistor M8 is connected to the first node N1. The source of the ninth transistor M9 is connected to the fifth node N5, the drain of the ninth transistor M9 is connected to the second node N2, and the gate of the ninth transistor M9 receives the second clock signal CK2. The first plate of the third capacitor C3 is connected to the fourth node N4, and the second plate of the third capacitor C3 is connected to the fifth node N5. The first plate of the fourth capacitor C4 receives the second voltage signal Vgh, and the second plate of the fourth capacitor C4 is connected to the second node N2. The third control unit 03 includes a tenth transistor M10, an eleventh transistor M11, and a fourth capacitor C4. The source of the tenth transistor M10 receives the first voltage signal Vgl, the drain of the tenth transistor M10 outputs the output signal OUT, and the gate of the tenth transistor M10 is connected to the third node N3. The source of the eleventh transistor M11 receives the second voltage signal Vgh, the drain of the eleventh transistor M11 outputs the output signal OUT, and the gate of the eleventh transistor M11 is connected to the second node N2. The fourth control unit 04 includes a first capacitor C1, a first transistor M1, a second capacitor C2, and a second transistor M2. The first plate of the first capacitor C1 is connected to the third node N3, and the second plate of the first capacitor C1 receives the first control signal A1. The source of the first transistor M1 receives the first control signal A1, the drain of the first transistor M1 is connected to the second plate of the first capacitor C1, and the gate of the first transistor M1 receives the second control signal A2. The first plate of the second capacitor C2 is connected to the gate of the first transistor M1, and the second plate of the second capacitor C2 receives the second voltage signal Vgh. The gate of the first transistor M1 is connected to the first node N1, that is, the second control signal A2 is a potential signal of the first node N1. The source of the second transistor M2 is connected to the first node N1, the drain of the second transistor M2 is connected to the third node N3, and the gate of the second transistor M2 receives the first control signal A1. Within the first time period, the first control signal A1 controls the second transistor M2 to be on, the first control signal A1 is a low level signal, and the second control signal A2 controls the first transistor M1 to be on. FIG. 20 is a timing diagram of the circuit structure shown in FIG. 19. The timing will be described in detail below with reference to FIGS. 19 and 20.

At the first stage T1, the input signal IN is at a high level, the first clock signal CK1 is at a low level, the second clock signal CK2 is at a high level, the fourth transistor M4 is on, the first node N1 is at a high level, the fourth node N4 is at a low level, the first control signal A1 is at a high level, the second transistor M2 is off, the third node N3 remains at a low level, the second node N2 is at a high level, and the output signal OUT is at a low level.

At the second stage T2, the input signal IN is at a high level, the first control signal A1 is at a low level, the second clock signal CK2 is at a high level, the first node N1 is at a high level, the second transistor M2 is on, the third node N3 is at a high level, the fourth node N4 is at a low level, the second node N2 is at a high level, and the output signal OUT remains at a low level.

At the third stage T3, the input signal IN is at a high level, the second clock signal CK2 is at a low level, the first node N1 is at a high level, the third node N3 is at a high level, the fourth node N4 is at a low level, the sixth transistor M6 and the ninth transistor M9 are on, the second node N2 becomes at a low level, the eleventh transistor M11 is on, and the output signal OUT remains at a low level.

At the fourth stage T4, the input signal IN is at a high level, the second clock signal CK2 is at a high level, the first node N1 is at a high level, the third node N3 is at a high level, the fourth node N4 is at a low level, the second node N2 is at a low level, and the output signal OUT remains at a high level.

At the fifth stage T5, the input signal IN is at a low level, the first clock signal CK1 is at a high level, the first control signal A1 is at a high level, the second clock signal CK2 is at a low level, the first node N1 is at a high level, the third node N3 is at a high level, the fourth node N4 is at a low level, the second node N2 is at a low level, and the output signal OUT remains at a high level.

At the sixth stage T6, the input signal IN is at a low level, the first clock signal CK1 is at a low level, the second clock signal CK2 is at a high level, the first node N1 is at a low level, the fifth transistor M5 is on, the fourth node N4 is at a low level, the first control signal A1 is at a high level, the second transistor M2 is off, and the third node N3 is at a high level. Since the eighth transistor M8 is on, the second node N2 becomes at a high level, the tenth transistor M10 and the eleventh transistor M11 are off, and the output signal OUT remains at a high level.

At the seventh stage T7, the input signal IN is at a low level, the first control signal A1 is at a low level, and the first node N1 is at a low level. Within the first time period X1, the first capacitor C1 is rapidly charged and thus pulls down the potential of the first node N1 to the potential of the first low level signal V1 so that the potential of the first low level signal V1 is less than the potential of the first voltage signal Vgl, and the second transistor M2 is on, so the potential of the third node N3 is the potential of the first low level signal V1. The fourth node N4 and the second node N2 both are on, and the eleventh transistor M11 is off. Since the potential of the third node N3 is less than the potential of the first voltage signal Vgl, the potential of the gate of the tenth transistor M10 is less than the potential of the source of the tenth transistor M10, the tenth transistor M10 can rapidly approach a saturation state, the tenth transistor M10 is on, and the output signal OUT of the shift register substantially coincides with the first voltage signal Vgl, thereby avoiding the tailing phenomenon of the output signal.

Figure 21:
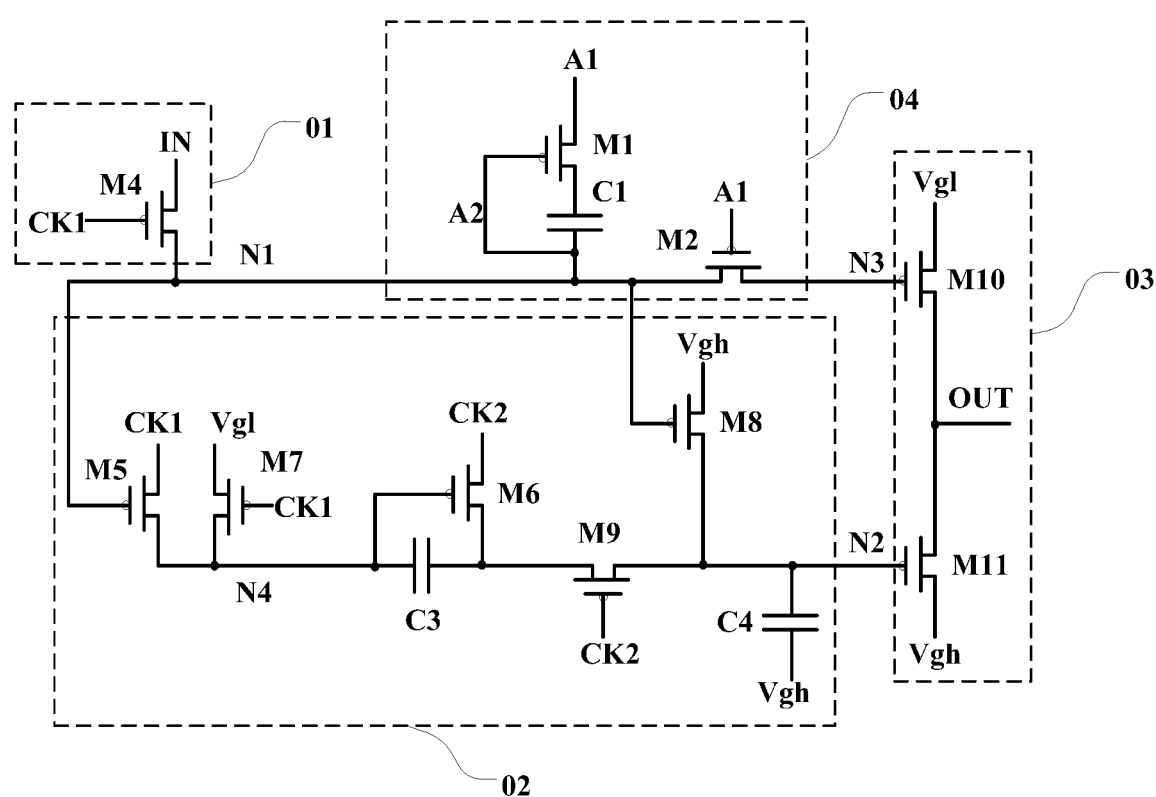
FIG. 21 is a structural diagram of another shift register of a display panel according to an embodiment of the present disclosure.
Figure 22:
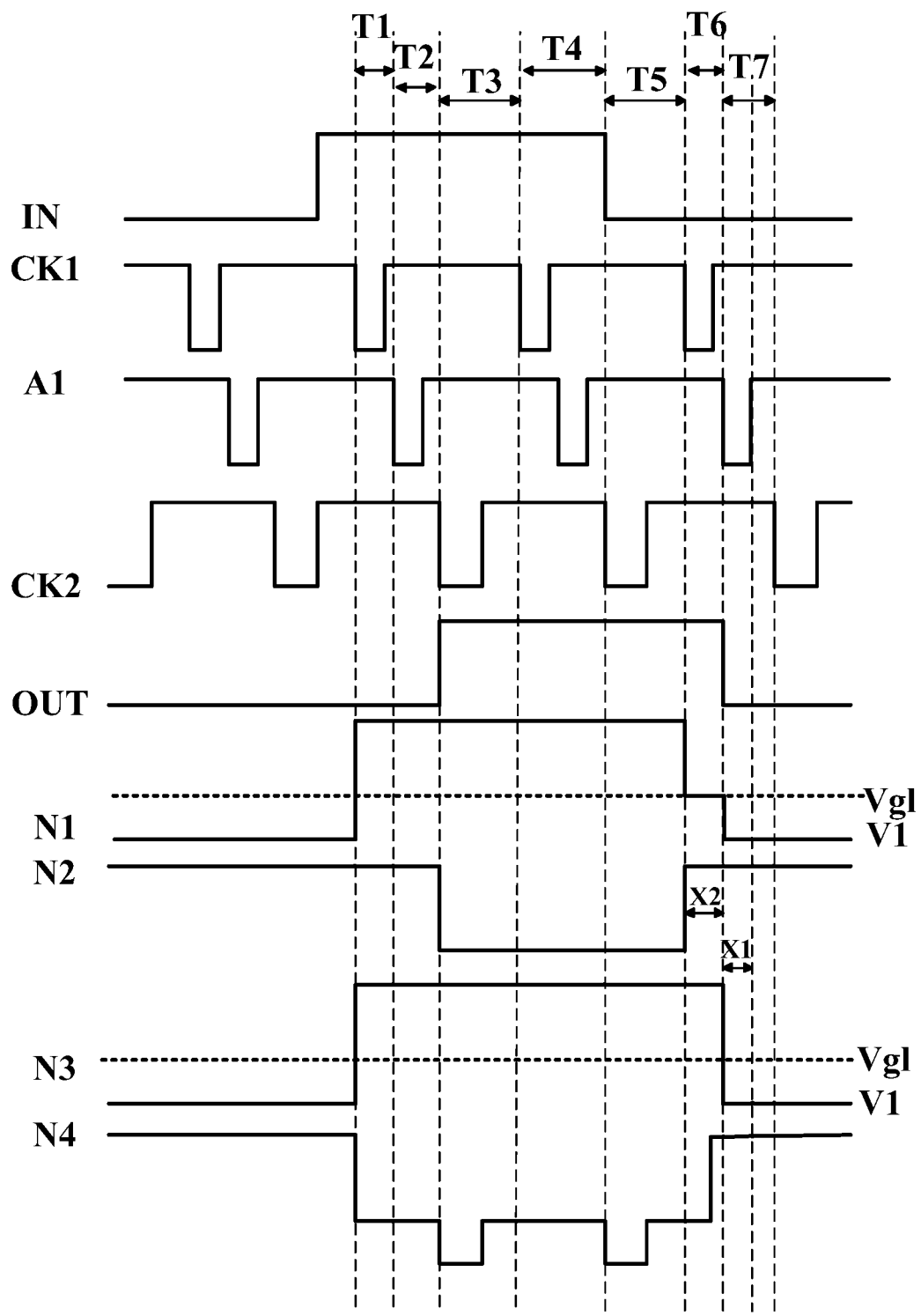
FIG. 22 is a timing diagram of the circuit structure shown in FIG. 21.

FIG. 21 is a schematic diagram of the circuit structure of another shift register according to an embodiment of the present disclosure. As shown in FIG. 21, the first control unit 01 includes a fourth transistor M4. The source of the fourth transistor M4 receives the input signal IN, the drain of the fourth transistor M4 is connected to the first node N1, and the gate of the fourth transistor M4 receives the first clock signal CK1. The second control unit 02 includes a fifth transistor M5, a sixth transistor M6, a seventh transistor M7, an eighth transistor M8, a ninth transistor M9, a third capacitor C3, and a fourth capacitor C4. The source of the fifth transistor M5 receives the first clock signal CK1, the drain of the fifth transistor M5 is connected to the fourth node N4, and the gate of the fifth transistor M5 is connected to the first node N1. The source of the sixth transistor M6 receives the second clock signal CK2, the drain of the sixth transistor M6 is connected to the fifth node N5, and the gate of the sixth transistor M6 is connected to the fourth node N4. The source of the seventh transistor M7 receives the first voltage signal Vgl, the drain of the seventh transistor M7 is connected to the fourth node M4, and the gate of the seventh transistor M7 receives the first clock signal CK1. The source of the eighth transistor M8 receives the second voltage signal Vgh, the drain of the eighth transistor M8 is connected to the second node N2, and the gate of the eighth transistor M8 is connected to the first node N1. The source of the ninth transistor M9 is connected to the fifth node N5, the drain of the ninth transistor M9 is connected to the second node N2, and the gate of the ninth transistor M9 receives the second clock signal CK2. The first plate of the third capacitor C3 is connected to the fourth node N4, and the second plate of the third capacitor C3 is connected to the fifth node N5. The first plate of the fourth capacitor C4 receives the second voltage signal Vgh, and the second plate of the fourth capacitor C4 is connected to the second node N2. The third control unit 03 includes a tenth transistor M10, an eleventh transistor M11, and a fourth capacitor C4. The source of the tenth transistor M10 receives the first voltage signal Vgl, the drain of the tenth transistor M10 outputs the output signal OUT, and the gate of the tenth transistor M10 is connected to the third node N3. The source of the eleventh transistor M11 receives the second voltage signal Vgh, the drain of the eleventh transistor M11 outputs the output signal OUT, and the gate of the eleventh transistor M11 is connected to the second node N2. The fourth control unit 04 includes a first capacitor C1. The first plate of the first capacitor C1 is connected to the third node N3, and the second plate of the first capacitor C1 receives the first control signal A1. The fourth control unit 04 includes a first capacitor C1. The first plate of the first capacitor C1 is connected to the third node N3, and the second plate of the first capacitor C1 receives the first control signal A1. The fourth control unit 04 includes a first transistor M1. The source of the first transistor M1 receives the first control signal A1, the drain of the first transistor M1 is connected to the second plate of the first capacitor C1, and the gate of the first transistor M1 receives the second control signal A2. In this embodiment, the second control signal A2 is the signal of the first node N1. Within the first time period, the first control signal A1 is a low level signal, and the second control signal A2 controls the first transistor M1 to be on. In addition, the fourth control unit 04 further includes a second transistor M2. The source of the second transistor M2 is connected to the first node N1, the drain of the second transistor M2 is connected to the third node N3, the gate of the second transistor M2 receives the first control signal A1, and the first control signal A1 controls the second transistor M2 to be on within the first time period. FIG. 22 is a timing diagram of the circuit structure shown in FIG. 21. The timing will be described in detail below with reference to FIGS. 21 and 22.

At the first stage T1, the input signal IN is at a high level, the first clock signal CK1 is at a low level, the second clock signal CK2 is at a high level, the fourth transistor M4 is on, the first node N1 is at a high level, the first control signal A1 is at a high level, the second transistor M2 is off, the third node N3 remains at a high potential, the seventh transistor M7 is on, and the fourth node N4 is at a low level. The second node N2 is at a high level, the eleventh transistor M11 is off, the tenth transistor M10 is on, and the output signal OUT is at a low level.

At the second stage T2, the input signal IN is at a high level, the first clock signal CK1 is at a high level, the first control signal A1 is at a low level, the second clock signal CK2 is at a high level, the first node N1 is at a high level, the second transistor M2 is on, the third node N3 is at a high level, the fourth node N4 is at a low level, the second node N2 is at a low level, and the output signal OUT remains at a low level.

At the third stage T3, the input signal IN is at a high level, the first clock signal CK1 is at a high level, the first control signal A1 is at a low level, the first control signal A1 is at a high level, the first node N1 is at a high level, the third node N3 is at a high level, the fourth node N4 is at a low level, the sixth transistor M6 and the ninth transistor M9 are both on, the second node N2 is at a low level, the eleventh transistor M11 is on, and the output signal OUT remains at a high level.

At the fourth stage T4, the input signal IN is at a high level, the second clock signal CK2 is at a high level, the first node N1 is at a high level, the third node N3 is at a high level, the fourth node N4 is at a low level, the second node N2 is at a low level, and the output signal OUT remains at a high level.

At the fifth stage T5, the input signal IN is at a low level, the second clock signal CK2 is at a low level, the first node N1 is at a high level, the third node N3 is at a high level, the fourth node N4 is at a low level, the second node N2 is at a low level, and the output signal OUT remains at a high level.

At the sixth stage T6, the input signal IN is at a low level, the first clock signal CK1 is at a low level, the second clock signal CK2 is at a high level, the first node N1 is at a low level, the fourth node N4 is at a low level, the first control signal A1 is at a high level, the second transistor M2 is off, and the third node N3 is at a high level. Since the eighth transistor M8 is on, the second node N2 becomes at a high level, the tenth transistor M10 and the eleventh transistor M11 are off, and the output signal OUT remains at a high level.

At the seventh stage T7, the input signal IN is at a low level, and the first control signal A1 is at a low level. Within the first time period X1, the first capacitor C1 is rapidly charged and thus pulls down the potential of the first node N1 to the potential of the first low level signal V1 so that the potential of the first low level signal V1 is less than the potential of the first voltage signal Vgl, and the second transistor M2 is on, so the potential of the third node N3 is the potential of the first low level signal V1. The fourth node N4 is at a high level, the second node N2 is at a high level, and the eleventh transistor M11 is off. Since the potential of the third node N3 is less than the potential of the first voltage signal Vgl, the potential of the gate of the tenth transistor M10 is less than the potential of the source of the tenth transistor M10, the tenth transistor M10 can rapidly approach a saturation state, the tenth transistor M10 is on, and the output signal OUT of the shift register substantially coincides with the first voltage signal Vgl, thereby avoiding the tailing phenomenon of the output signal.

Figure 23:
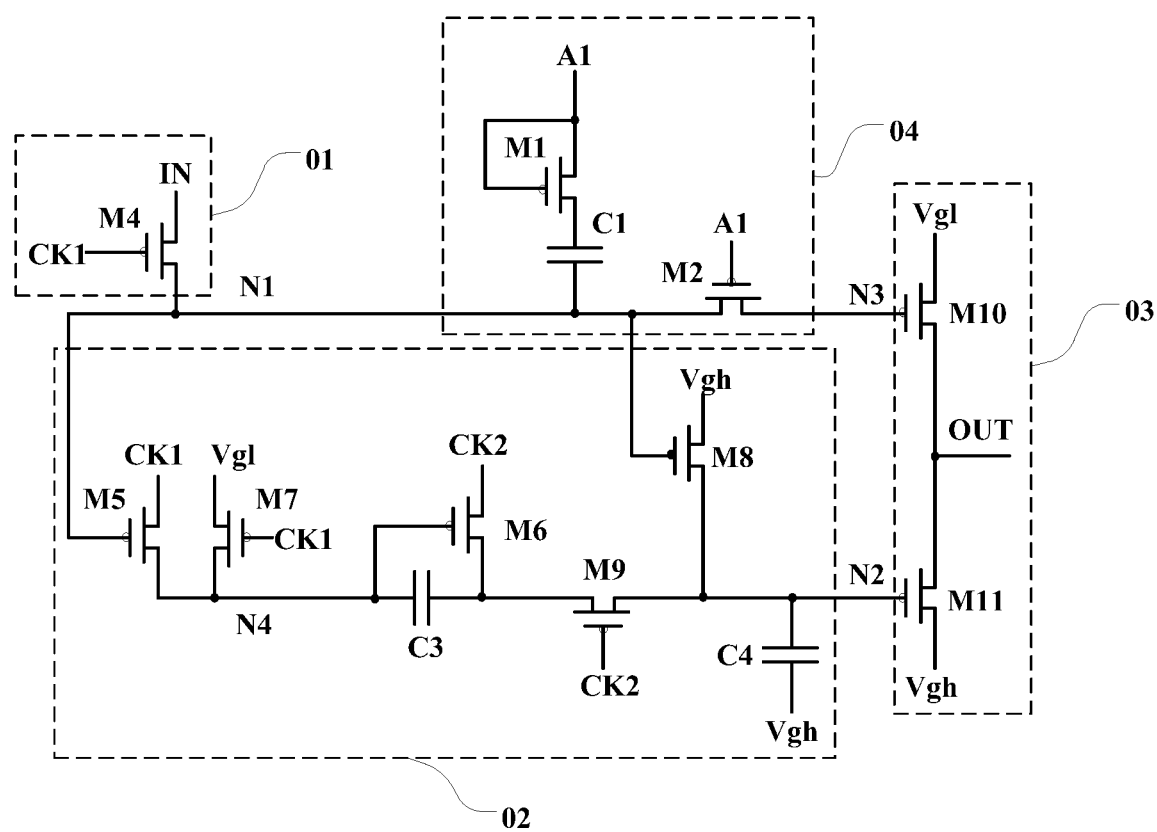
FIG. 23 is a structural diagram of another shift register of a display panel according to an embodiment of the present disclosure.
Figure 24:
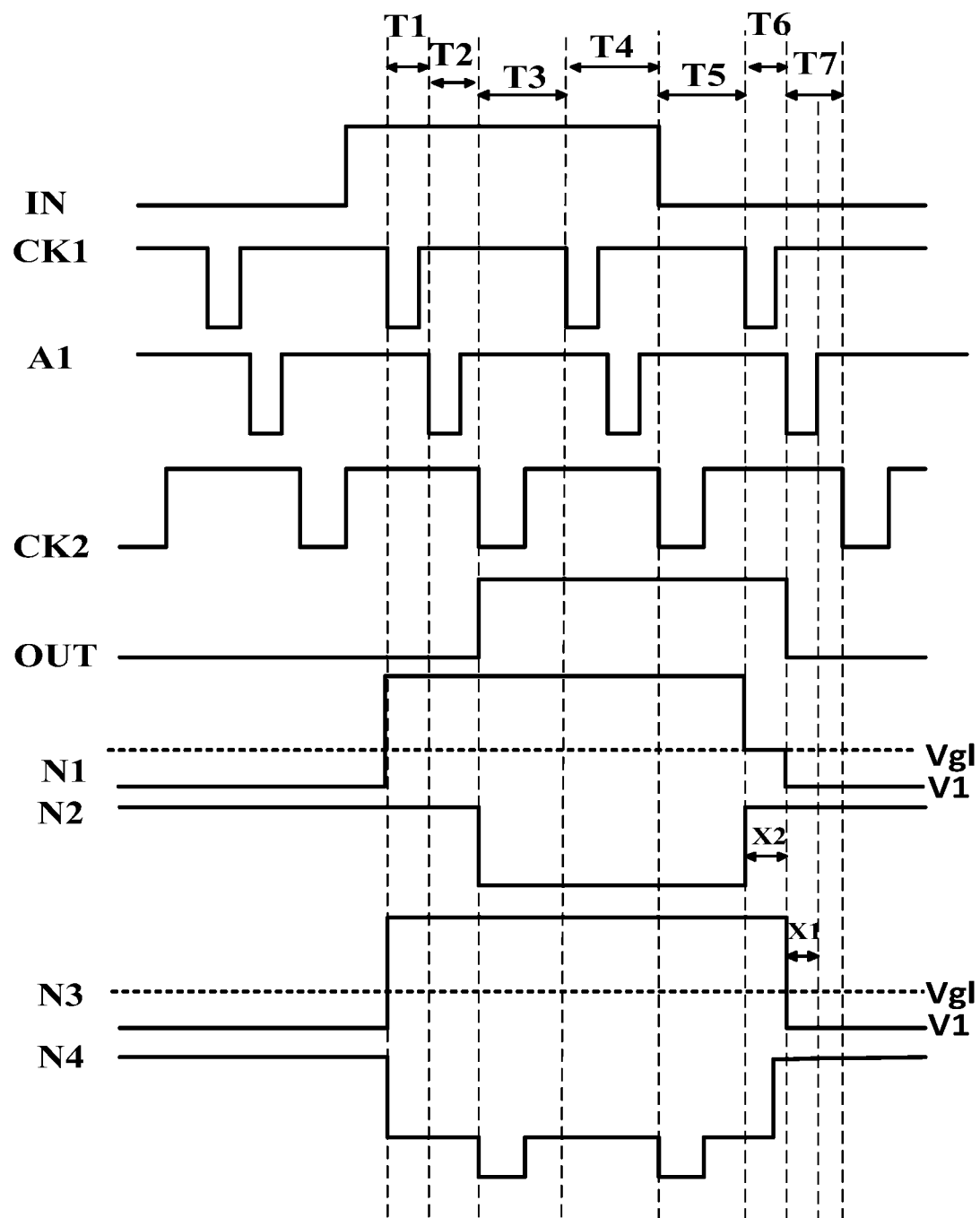
FIG. 24 is a timing diagram of the circuit structure shown in FIG. 23.

FIG. 23 is a schematic diagram of the circuit structure of another shift register according to an embodiment of the present disclosure. As shown in FIG. 23, the first control unit 01 includes a fourth transistor M4. The source of the fourth transistor M4 receives the input signal IN, the drain of the fourth transistor M4 is connected to the first node N1, and the gate of the fourth transistor M4 receives the first clock signal CK1. The second control unit 02 includes a fifth transistor M5, a sixth transistor M6, a seventh transistor M7, an eighth transistor M8, a ninth transistor M9, a third capacitor C3, and a fourth capacitor C4. The source of the fifth transistor M5 receives the first clock signal CK1, the drain of the fifth transistor M5 is connected to the fourth node N4, and the gate of the fifth transistor M5 is connected to the first node N1. The source of the sixth transistor M6 receives the second clock signal CK2, the drain of the sixth transistor M6 is connected to the fifth node N5, and the gate of the sixth transistor M6 is connected to the fourth node N4. The source of the seventh transistor M7 receives the first voltage signal Vgl, the drain of the seventh transistor M7 is connected to the fourth node M4, and the gate of the seventh transistor M7 receives the first clock signal CK1. The source of the eighth transistor M8 receives the second voltage signal Vgh, the drain of the eighth transistor M8 is connected to the second node N2, and the gate of the eighth transistor M8 is connected to the first node N1. The source of the ninth transistor M9 is connected to the fifth node N5, the drain of the ninth transistor M9 is connected to the second node N2, and the gate of the ninth transistor M9 receives the second clock signal CK2. The first plate of the third capacitor C3 is connected to the fourth node N4, and the second plate of the third capacitor C3 is connected to the fifth node N5. The first plate of the fourth capacitor C4 receives the second voltage signal Vgh, and the second plate of the fourth capacitor C4 is connected to the second node N2. The third control unit 03 includes a tenth transistor M10, an eleventh transistor M11, and a fourth capacitor C4. The source of the tenth transistor M10 receives the first voltage signal Vgl, the drain of the tenth transistor M10 outputs the output signal OUT, and the gate of the tenth transistor M10 is connected to the third node N3. The source of the eleventh transistor M11 receives the second voltage signal Vgh, the drain of the eleventh transistor M11 outputs the output signal OUT, and the gate of the eleventh transistor M11 is connected to the second node N2. The fourth control unit 04 includes a first capacitor C1. The first plate of the first capacitor C1 is connected to the third node N3, and the second plate of the first capacitor C1 receives the first control signal A1. The fourth control unit 04 includes a first transistor M1. The source of the first transistor M1 receives the first control signal A1, the drain of the first transistor M1 is connected to the second plate of the first capacitor C1, and the gate of the first transistor M1 receives the second control signal A2. In this embodiment, the first control signal A1 and the second control signal A2 are the same signal. Within the first time period, the first control signal A1 is a low level signal, and the second control signal A2 controls the first transistor M1 to be on. FIG. 24 is a timing diagram of the circuit structure shown in FIG. 23. The timing will be described in detail below with reference to FIGS. 23 and 24.

At the first stage T1, the input signal IN is at a high level, the first clock signal CK1 is at a low level, the second clock signal CK2 is at a high level, the fourth transistor M4 is on, the first node N1 is at a high level, the seventh transistor M7 is on, the fourth node N4 is at a low level, the first control signal A1 is at a high level, the third node N3 remains at a low potential, the second node N2 is at a high level, the eleventh transistor M11 is off, and the fourth node N4 remains at a low level.

At the second stage T2, the input signal IN is at a high level, the first clock signal CK1 is at a low level, the second clock signal CK2 is at a high level, the first node N1 is at a high level, the fourth node N4 is at a low level, the second transistor M2 is on, the third node N3 is at a high level, the second node N2 is at a high level, and the output signal OUT remains at a low level.

At the third stage T3, the input signal IN is at a high level, the second clock signal CK2 is at a low level, the first node N1 is at a high level, the third node N3 is at a high level, the fourth node N4 is at a low level, the second node N2 is at a low level, the eleventh transistor M11 is on, and the output signal OUT is at a high level.

At the fourth stage T4, the input signal IN is at a high level, the second clock signal CK2 is at a high level, the first node N1 is at a high level, the third node N3 is at a high level, the fourth node N4 is at a low level, the second node N2 is at a low level, and the output signal OUT remains at a high level.

At the fifth stage T5, the input signal IN is at a low level, the second clock signal CK2 is at a low level, the first node N1 is at a high level, the third node N3 is at a high level, the fourth node N4 is at a low level, the second node N2 is at a low level, and the output signal OUT remains at a high level.

At the sixth stage T6, the input signal IN is at a low level, the first clock signal CK1 is at a low level, the second clock signal CK2 is at a high level, the first node N1 is at a low level, the fourth node N4 is at a low level, the first control signal A1 is at a high level, the second transistor M2 is off, and the third node N3 is at a high level. Since the eighth transistor M8 is on, the second node N2 becomes at a high level, the tenth transistor M10 and the eleventh transistor M11 are off, and the output signal OUT remains at a high level.

At the seventh stage T7, the input signal IN is at a low level, and the first control signal A1 is at a low level. Within the first time period X1, the first capacitor C1 is rapidly charged and thus pulls down the potential of the first node N1 to the potential of the first low level signal V1 so that the potential of the first low level signal V1 is less than the potential of the first voltage signal Vgl, and the second transistor M2 is on, so the potential of the third node N3 is the potential of the first low level signal V1. The fourth node N4 is at a high level, the second node N2 is at a high level, and the eleventh transistor M11 is off. Since the potential of the third node N3 is less than the potential of the first voltage signal Vgl, the potential of the gate of the tenth transistor M10 is less than the potential of the source of the tenth transistor M10, the tenth transistor M10 can rapidly approach a saturation state, the tenth transistor M10 is on, and the output signal OUT of the shift register substantially coincides with the first voltage signal Vgl, thereby avoiding the tailing phenomenon of the output signal.

Figure 25:
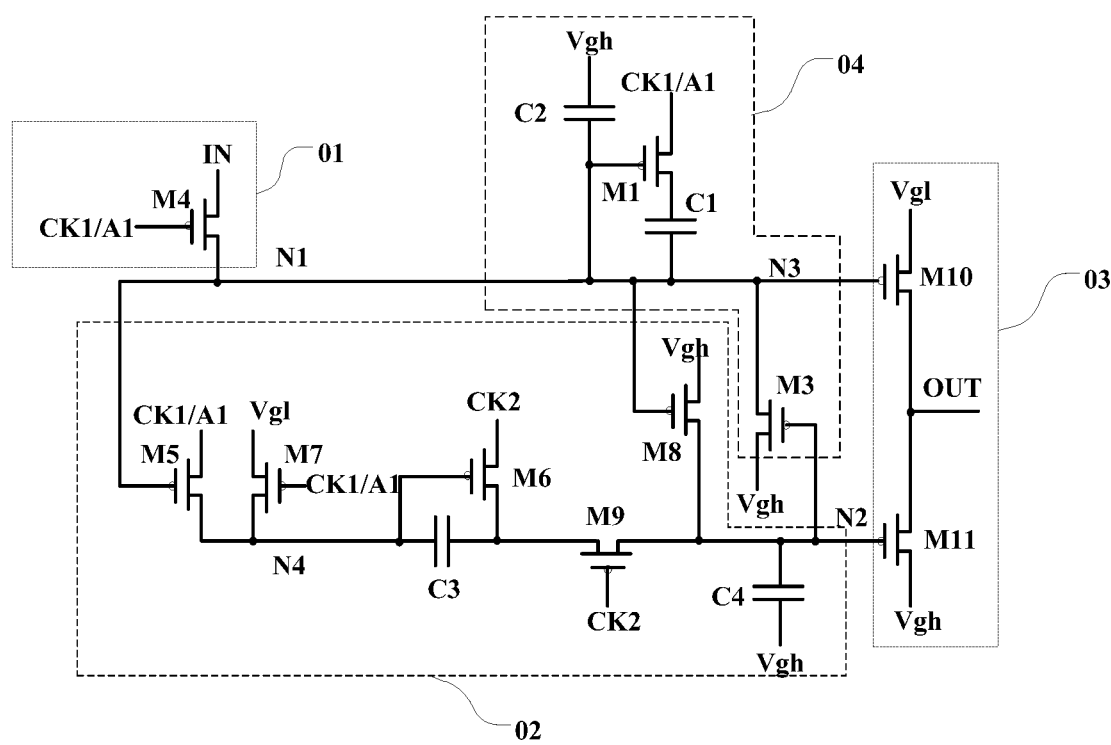
FIG. 25 is a structural diagram of another shift register of a display panel according to an embodiment of the present disclosure.

FIG. 25 is a schematic diagram of the circuit structure of another shift register according to an embodiment of the present disclosure. As shown in FIG. 25, the first control unit 01 includes a fourth transistor M4. The source of the fourth transistor M4 receives the input signal IN, the drain of the fourth transistor M4 is connected to the first node N1, and the gate of the fourth transistor M4 receives the first clock signal CK1. The second control unit 02 includes a fifth transistor M5, a sixth transistor M6, a seventh transistor M7, an eighth transistor M8, a ninth transistor M9, a third capacitor C3, and a fourth capacitor C4. The source of the fifth transistor M5 receives the first clock signal CK1, the drain of the fifth transistor M5 is connected to the fourth node N4, and the gate of the fifth transistor M5 is connected to the first node N1. The source of the sixth transistor M6 receives the second clock signal CK2, the drain of the sixth transistor M6 is connected to the fifth node N5, and the gate of the sixth transistor M6 is connected to the fourth node N4. The source of the seventh transistor M7 receives the first voltage signal Vgl, the drain of the seventh transistor M7 is connected to the fourth node M4, and the gate of the seventh transistor M7 receives the first clock signal CK1. The source of the eighth transistor M8 receives the second voltage signal Vgh, the drain of the eighth transistor M8 is connected to the second node N2, and the gate of the eighth transistor M8 is connected to the first node N1. The source of the ninth transistor M9 is connected to the fifth node N5, the drain of the ninth transistor M9 is connected to the second node N2, and the gate of the ninth transistor M9 receives the second clock signal CK2. The first plate of the third capacitor C3 is connected to the fourth node N4, and the second plate of the third capacitor C3 is connected to the fifth node N5. The first plate of the fourth capacitor C4 receives the second voltage signal Vgh, and the second plate of the fourth capacitor C4 is connected to the second node N2. The third control unit 03 includes a tenth transistor M10, an eleventh transistor M11, and a fourth capacitor C4. The source of the tenth transistor M10 receives the first voltage signal Vgl, the drain of the tenth transistor M10 outputs the output signal OUT, and the gate of the tenth transistor M10 is connected to the third node N3. The source of the eleventh transistor M11 receives the second voltage signal Vgh, the drain of the eleventh transistor M11 outputs the output signal OUT, and the gate of the eleventh transistor M11 is connected to the second node N2. The fourth control unit 04 includes a first capacitor C1, a first transistor M1, a second capacitor C2, and a third transistor M3. The first plate of the first capacitor C1 is connected to the third node N3, and the second plate of the first capacitor C1 is connected to the first control signal A1. The source of the first transistor M1 receives the first control signal A1, the drain of the first transistor M1 is connected to the second plate of the first capacitor C1, and the gate of the first transistor M1 receives the second control signal A2. The first plate of the second capacitor C2 is connected to the gate of the first transistor M1, and the second plate of the second capacitor C2 receives the second voltage signal Vgh. The gate of the first transistor M1 is connected to the first node N1, that is, the second control signal A2 is a potential signal of the first node N1. The source of the third capacitor M3 receives the second voltage signal Vgh, the drain of the third transistor M3 is connected to the third node N3, and the gate of the third transistor M3 is connected to the second node N2. In this embodiment, the first clock signal CK1 and the first control signal A1 are the same signal. Within the first time period X1, the first control signal A1 is a low level signal, the second control signal A2 controls the first transistor M1 to be on, and the second node N2 controls the third transistor M3 to be off. For the timing of the circuit structure shown in FIG. 25, reference may be made to the description OF FIG. 18. Compared with the solutions shown in FIGS. 17 and 18, in this embodiment of the present disclosure, the potential of the second node N2 may be used to control the potential of the third node to ensure the signal stability when the third node N3 is at the high level. Since each clock signal is subjected to multiple transitions, the potential of the first node N1 and the potential of the third node N3 may float in the transition process. In this embodiment of the present disclosure, the third transistor M3 is provided, and when the second node N2 is at a low level, the third transistor M3 is on to control the third node N3 to be stabilized at a high level. Before the second node N2 becomes at a high level, the third transistor M3 is off so that the potential of the third node N3 does not change, and only when the second node N2 becomes at a high level does the potential of the third node N3 become a potential lower than the potential of the first voltage signal Vgl, thereby reducing the tailing phenomenon.

In an embodiment, the first control signal and the first clock signal are pulse signals of different timing, and the first control signal and the second clock signal are pulse signals of different timing, where active pulses of the first clock signal, the first control signal, and the second clock signal are sequentially generated. For the above description, for example, a reference may be made to FIGS. 20, 22, and 24.

In an embodiment, the duration of the active pulse of the first clock signal is less than or equal to the duration of the active pulse of the second clock signal, and the duration of the active pulse of the first control signal is less than or equal to the duration of the active pulse of the second clock signal. For the above description, for example, a reference may be made to FIGS. 20, 22, and 24.

In an embodiment, the duration of the active pulse of the first control signal is less than or equal to the duration of the active pulse of the first clock signal. Since the first clock signal needs to participate in the driving process of the first control unit, the second control unit, and the third control unit, and the first control signal only needs to control the fourth control unit. Therefore, the duration of the active pulse of the first control signal may be set to be less than or equal to the duration of the active pulse of the first clock signal to save the duration of the active pulse and save the power consumption.

In an embodiment, the sum of the duration of the active pulse of the first clock signal and the duration of the active pulse of the first control signal is equal to or greater than the duration of the active pulse of the second clock signal. The first clock signal and the first control signal control the potential change of both the first node and the third node N3 together, and the second clock signal controls the potential change of the second node N2. In some implementations of the present disclosure, the sum of the active pulses of the first clock signal and the first control signal may be set equal to the active pulse of the second clock signal. In order to ensure the potential of the third node N3 is pulled down within at least the first time period in which the first node is at a low potential, the duration of the active pulse of the first control signal may be appropriately increased to ensure that the output signal of the shift register is free of tailing.

In an embodiment, the active pulse of the first clock signal at least partially overlaps the active pulse of the first control signal. The active pulse of the first clock signal may at least partially overlap the active pulse of the first control signal so that the active pulse of the first clock signal and the active pulse of the first control signal can be appropriately increased to ensure stable control of the potentials of the first node and the third node under the premise that the driving period is unchanged.

In an embodiment, the on time of the active pulse of the first clock signal is earlier than the on time of the active pulse of the first control signal, and the end time of the active pulse of the first clock signal is earlier than or equal to the end time of the active pulse of the first control signal. Since the potential of the first node N1 needs to continue to be pulled down by the fourth control unit after the first node N1 changes from a high level to a low level, the on time of the active pulse of the first clock signal needs to be earlier than the on time of the active pulse of the first control signal. In this embodiment of the present disclosure, the end time of the active pulse of the first clock signal is set to be earlier than or synchronize the end time of the active pulse of the first control signal so that it is ensured that the fourth control unit continues to control the potential of the third node N3 to be pulled down within at least the first period in which the potential of the first node is at a low level. If the end time of the active pulse of the first clock signal is later than the end time of the active pulse of the first control signal, the potential of the third node may change back to the potential before the first node potential is not pulled down.

In an embodiment, the active pulse of the first control signal may also be set to have no overlap with the active pulse of the first clock signal according to the demands of the actual product, as shown in FIGS. 20, 22, and 24.

In an embodiment, during a complete process of an inactive pulse shift from the input signal to the output signal, the on time of an inactive pulse of the input signal is first interval earlier than the on time of the active pulse of the first clock signal, and the on time of the active pulse of the first clock signal is second interval earlier than the on time of the active pulse of the first control signal, where the first interval is equal to the second interval. For example, with reference to FIG. 20, the inactive pulse of the input signal IN is at a high level, and the on time of the inactive pulse of the input signal IN is earlier than the on time of the active pulse (low level) of the first clock signal CK1 by first interval t1. The on time of the active pulse (low level) of the first clock signal CK1 is earlier than the on time of the active pulse of the first control signal A1 by the second interval t2. With the addition of the control of the first control signal A1, the output signal OUT changes from the high level to the low level at the on time of the active pulse of the first control signal A1, and the falling edge of the output signal OUT is delayed by the second interval t2 is the difference between the on time of the active pulse (low level) of the first clock signal CK1 and the on time of the active pulse of the first control signal A1. Therefore, the rising edge of the input signal IN is earlier than the falling edge of the first clock signal CK1 by the first time interval t1 which is equal to the second time interval t2, so as to ensure that the inactive pulse widths of the input signal IN and the output signal OUT are equal to each other and their waveforms are also consistent with each other.

In an embodiment, the second clock signal outputs an inactive pulse within the first time period. For example, with reference to FIG. 20, in this embodiment of the present disclosure, within the first time period X1 before the second clock signal CK2 outputs the active pulse (low level), the third node N3 is rapidly pulled down to a potential lower than that of the first voltage signal Vgl so that the tailing phenomenon is eliminated as much as possible.

In an embodiment, the time period for receiving the low-level signal by the first node further includes a second time period X2, and the potential of the third node is the first low level signal within the first time period X1 and the potential of the third node is a high level signal within the second time period X2. For example, with reference to FIGS. 20, 22, and 24, within the second time period X2, the first clock signal CK1 is at a low level, and when the first control signal is at a high level, the third node N3 remains a high level signal. Within the first time period X1 after the first control signal A1 becomes at a low level, the third node N3 is pulled down to a potential lower than the potential of the first voltage signal Vgl so that the tailing phenomenon is eliminated as much as possible.

Figure 26:
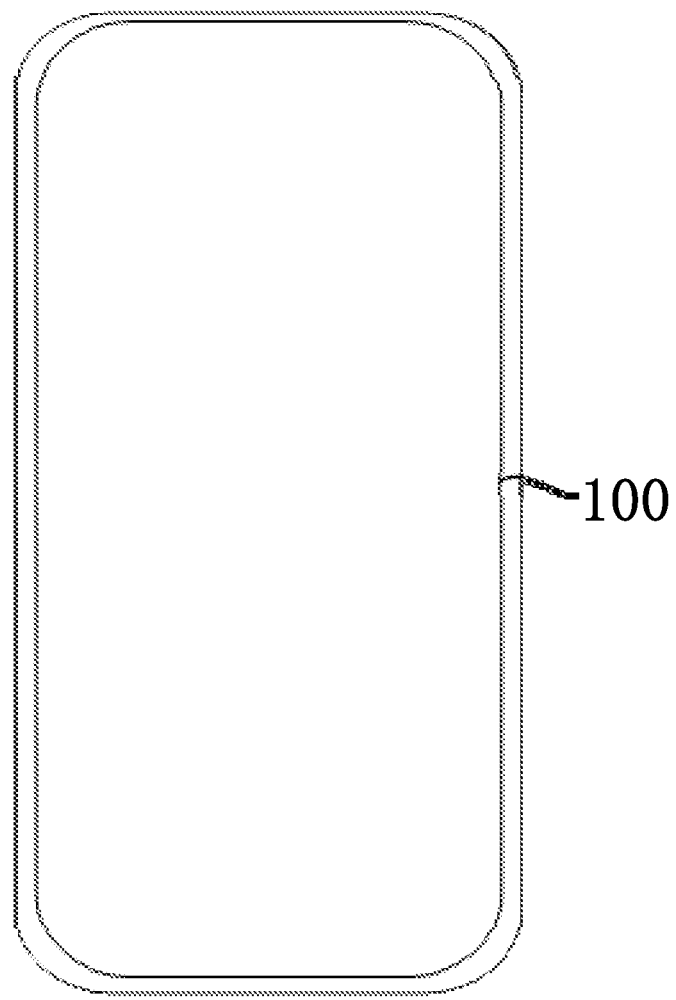
FIG. 26 is a structural diagram of a display device according to an embodiment of the present disclosure.

Based on the same concept described above, an embodiment of the present disclosure further provides a display device. The display device includes the display panel described in any embodiment of the present disclosure. Therefore, the display device provided by this embodiment of the present disclosure has the corresponding beneficial effects of the display panel provided by the embodiments of the present disclosure, which is not repeated here. Exemplarily, the display device may be a mobile phone, a computer, a smart wearable device (for example, a smartwatch), an onboard display device, and other electronic devices, which is not limited in the embodiments of the present disclosure. Exemplarily, FIG. 26 is a structural diagram of a display device according to an embodiment of the present disclosure. As shown in FIG. 26, the display device includes the display panel 100 in the embodiments described above.

It is to be noted that the preceding are only preferred embodiments of the present disclosure and the technical principles used therein. It is to be understood by those skilled in the art that the present disclosure is not limited to the embodiments described herein. Those skilled in the art can make various apparent modifications, adaptations, and substitutions without departing from the scope of the present disclosure. Therefore, while the present disclosure has been described in detail via the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A display panel, comprising:
    a driver circuit comprising a shift register that is N-stage cascaded, wherein N is a number greater than or equal to 2;
    wherein the shift register comprises:
    a third control unit configured to receive a first voltage signal and generate an output signal in response to a signal of a third node, or receive a second voltage signal and generate an output signal in response to a signal of a second node, wherein the first voltage signal is a low level signal, and the second voltage signal is a high level signal; and
    a fourth control unit comprising a first capacitor and a first transistor, wherein a second plate of the first capacitor is connected to a drain of the first transistor,
    wherein the first capacitor and the first transistor satisfy at least one of:
    a first plate of the first capacitor and a gate of the first transistor are connected to a same node; or
    a first plate of the first capacitor and a gate of the first transistor receive a same signal.

2. The display panel of claim 1, wherein
    a source of the first transistor receives a first control signal.

3. The display panel of claim 2, wherein
    the shift register comprises a first control unit configured to receive an input signal and control a signal of a first node in response to a first clock signal, and the first node is connected to the third node.

4. The display panel of claim 3, wherein the first control signal and the first clock signal are pulse signals having different timing.

5. The display panel of claim 3, wherein a duration of an active pulse of the first control signal is less than or equal to a duration of an active pulse of the first clock signal.

6. The display panel of claim 5, wherein the display panel comprises at least one of:
    the active pulse of the first control signal at least partially overlaps the active pulse of the first clock signal; or
    the active pulse of the first control signal has no overlap with the active pulse of the first clock signal.

7. The display panel of claim 3, wherein the first control signal is a same signal as the first clock signal.

8. The display panel of claim 3, wherein during at least a first time period when a potential of the first node is a low level signal, the first transistor is turned on.

9. The display panel of claim 8, wherein during the first time period, the first control signal is a low level signal.

10. The display panel of claim 8, wherein the fourth control unit comprises a second transistor, a source of the second transistor is connected to the first node, and a drain of the second transistor is connected to the third node.

11. The display panel of claim 10, wherein during the first time period, the second transistor is turned on.

12. The display panel of claim 10, wherein a gate of the second transistor receives the first control signal.

13. The display panel of claim 3, wherein the gate of the first transistor receives a second control signal.

14. The display panel of claim 13, wherein the second control signal is the signal of the first node.

15. The display panel of claim 13, wherein the first control signal is a same signal as the second control signal.

16. The display panel of claim 3, wherein the shift register comprises:
    a second control unit configured to receive a first voltage signal and a second voltage signal and control a signal of a second node in response to the signal of the first node, the first clock signal, and a second clock signal.

17. The display panel of claim 16, wherein a sum of a duration of an active pulse of the first clock signal and a duration of an active pulse of the first control signal is equal to or greater than a duration of an active pulse of the second clock signal.

18. The display panel of claim 1, wherein the first plate of the first capacitor and the gate of the first transistor are connected to the third node.

19. The display panel of claim 1, wherein the fourth control unit further includes a second capacitor, a first plate of the second capacitor is connected to the gate of the first transistor, and a second plate of the second capacitor receives the second voltage signal.

20. A display device, comprising a display panel, wherein the display panel comprises:
a driver circuit comprising a shift register that is N-stage cascaded, wherein N is a number greater than or equal to 2;
wherein the shift register comprises:
a third control unit configured to receive a first voltage signal and generate an output signal in response to a signal of a third node, or receive a second voltage signal and generate an output signal in response to a signal of a second node, wherein the first voltage signal is a low level signal, and the second voltage signal is a high level signal; and
a fourth control unit comprising a first capacitor and a first transistor, wherein a second plate of the first capacitor is connected to a drain of the first transistor,
wherein the first capacitor and the first transistor satisfy at least one of:
a first plate of the first capacitor and a gate of the first transistor are connected to a same node; or
a first plate of the first capacitor and a gate of the first transistor receive a same signal.

* * * * *